United States Patent
Lee et al.

(10) Patent No.: US 8,506,711 B2
(45) Date of Patent: Aug. 13, 2013

(54) APPARATUS FOR MANUFACTURING FLAT-PANEL DISPLAY

(75) Inventors: Young Jong Lee, Sungnam-shi (KR); Jun Young Choi, Seoul (KR); Saeng Hyun Jo, Daejeon (KR); Byung-Oh Yoon, Gunpo-shi (KR); Gyeong-Hoon Kim, Anyang-shi (KR); Hong-Gi Jeong, Cheongju-shi (KR)

(73) Assignee: Advanced Display Process Engineering Co., Ltd., Seongnam-Si, Gyeonggi-Do (KR)

(*) Notice: Subject to any disclaimer, the term of this patent is extended or adjusted under 35 U.S.C. 154(b) by 0 days.

(21) Appl. No.: 12/358,752

(22) Filed: Jan. 23, 2009

(65) Prior Publication Data
US 2009/0133837 A1  May 28, 2009

Related U.S. Application Data

(63) Continuation of application No. 11/064,270, filed on Feb. 23, 2005, now abandoned.

(30) Foreign Application Priority Data

| Feb. 25, 2004 | (KR) | 10-2004-0012675 |
| Jun. 22, 2004 | (KR) | 10-2004-0046667 |
| Jun. 23, 2004 | (KR) | 10-2004-0047243 |
| Aug. 20, 2004 | (KR) | 10-2004-0066006 |
| Aug. 31, 2004 | (KR) | 10-2004-0069166 |
| Dec. 17, 2004 | (KR) | 10-2004-0108225 |
| Dec. 24, 2004 | (KR) | 10-2004-0111695 |

(51) Int. Cl.
  *C23C 16/44* (2006.01)
  *C23F 1/00* (2006.01)
  *H01L 21/306* (2006.01)
  *C23C 16/22* (2006.01)
  *C23C 16/06* (2006.01)

(52) U.S. Cl.
  USPC ............................... 118/715; 156/345.1

(58) Field of Classification Search
  USPC ............................... 118/715; 156/345.1
  See application file for complete search history.

(56) References Cited

U.S. PATENT DOCUMENTS

| 2,566,777 | A |   | 9/1951 | Thur |
| 4,134,425 | A | * | 1/1979 | Gussefeld et al. .......... 137/625.3 |
| 4,252,595 | A | * | 2/1981 | Yamamoto et al. ....... 156/345.31 |
| 4,309,261 | A | * | 1/1982 | Harding et al. ........... 204/192.15 |
| 4,451,316 | A | * | 5/1984 | Ishibashi et al. ............ 156/274.6 |
| 4,590,042 | A | * | 5/1986 | Drage ...................... 422/186.06 |
| 4,858,782 | A | * | 8/1989 | Yasumuro et al. ................ 220/8 |
| 5,020,475 | A | * | 6/1991 | Crabb et al. ................... 118/719 |
| 5,086,598 | A | * | 2/1992 | Weldy .......................... 52/288.1 |
| 5,135,635 | A | * | 8/1992 | Ikeda ....................... 204/298.25 |
| 5,137,755 | A | * | 8/1992 | Fujikawa et al. ............. 427/228 |
| 5,192,132 | A | * | 3/1993 | Pelensky ....................... 374/166 |
| 5,223,001 | A | * | 6/1993 | Saeki ........................... 29/25.01 |
| 5,314,574 | A | * | 5/1994 | Takahashi ..................... 438/706 |
| 5,392,322 | A | * | 2/1995 | Whitling et al. .............. 376/260 |
| 5,433,835 | A | * | 7/1995 | Demaray et al. ......... 204/298.09 |
| 5,487,822 | A | * | 1/1996 | Demaray et al. ......... 204/298.09 |
| 5,505,779 | A | * | 4/1996 | Mizuno et al. ................ 118/719 |
| 5,529,673 | A | * | 6/1996 | Strauss et al. ............ 204/298.12 |

(Continued)

*Primary Examiner* — Rudy Zervigon
(74) *Attorney, Agent, or Firm* — KED & Associates, LLP

(57) ABSTRACT

An flat-panel display (FPD) manufacturing apparatus is provided. The apparatus is flexibly configured so that it is capable of easily processing large-size substrates while also simplifying manufacturing, transporting, operating, and repair processes.

11 Claims, 15 Drawing Sheets

(56) References Cited

U.S. PATENT DOCUMENTS

| | | | |
|---|---|---|---|
| 5,565,071 A * | 10/1996 | Demaray et al. | 204/192.12 |
| 5,595,337 A * | 1/1997 | Demaray et al. | 228/193 |
| 5,640,296 A * | 6/1997 | Bonsall et al. | 361/679.27 |
| 5,676,803 A * | 10/1997 | Demaray et al. | 204/192.12 |
| 5,697,749 A * | 12/1997 | Iwabuchi et al. | 414/217 |
| 5,853,176 A * | 12/1998 | Kiriyama | 277/312 |
| 5,934,686 A * | 8/1999 | Ottenschlager | 277/591 |
| 5,980,194 A * | 11/1999 | Freerks et al. | 414/754 |
| 5,989,346 A * | 11/1999 | Hiroki | 118/719 |
| 6,013,162 A * | 1/2000 | Kobayashi et al. | 204/298.03 |
| 6,045,315 A | 4/2000 | Azumano et al. | |
| 6,048,154 A | 4/2000 | Wytman | |
| 6,073,576 A * | 6/2000 | Moslehi et al. | 118/723 E |
| 6,103,055 A * | 8/2000 | Maher et al. | 156/345.32 |
| 6,117,238 A * | 9/2000 | Begin | 118/500 |
| 6,152,070 A * | 11/2000 | Fairbairn et al. | 118/719 |
| 6,264,788 B1 * | 7/2001 | Tomoyasu et al. | 156/345.43 |
| 6,302,965 B1 * | 10/2001 | Umotoy et al. | 118/715 |
| 6,315,512 B1 | 11/2001 | Tabrizi et al. | |
| 6,551,045 B2 | 4/2003 | Binnard et al. | |
| 6,746,196 B1 | 6/2004 | Ozawa et al. | |
| 6,827,789 B2 * | 12/2004 | Lee et al. | 118/719 |
| 6,827,815 B2 * | 12/2004 | Hytros et al. | 156/345.33 |
| 6,872,258 B2 * | 3/2005 | Park et al. | 118/715 |
| 7,513,265 B2 * | 4/2009 | Yoshikawa et al. | 134/200 |
| 7,845,309 B2 * | 12/2010 | Condrashoff et al. | 118/723 E |
| 7,850,779 B2 * | 12/2010 | Ma et al. | 118/715 |
| 7,879,181 B2 * | 2/2011 | Lee et al. | 156/345.31 |
| 8,075,691 B2 * | 12/2011 | Lee et al. | 118/715 |
| 8,152,926 B2 * | 4/2012 | Lee et al. | 118/715 |
| 8,187,384 B2 * | 5/2012 | Lee et al. | 118/715 |
| 2002/0031420 A1 * | 3/2002 | Kroeker | 414/217 |
| 2002/0048506 A1 | 4/2002 | Babbs et al. | |
| 2003/0010452 A1 * | 1/2003 | Park et al. | 156/345.33 |
| 2003/0075273 A1 * | 4/2003 | Kilpela et al. | 156/345.33 |
| 2003/0124842 A1 * | 7/2003 | Hytros et al. | 438/680 |
| 2003/0132319 A1 * | 7/2003 | Hytros et al. | 239/548 |
| 2003/0143841 A1 * | 7/2003 | Yang et al. | 438/656 |
| 2003/0198754 A1 * | 10/2003 | Xi et al. | 427/576 |
| 2004/0018070 A1 | 1/2004 | Zhao et al. | |
| 2004/0082251 A1 * | 4/2004 | Bach et al. | 445/60 |
| 2005/0095089 A1 | 5/2005 | Hur et al. | |
| 2005/0183665 A1 * | 8/2005 | Lee et al. | 118/715 |
| 2005/0183824 A1 * | 8/2005 | Lee et al. | 156/345.31 |
| 2005/0194093 A1 * | 9/2005 | Makino et al. | 156/345.27 |
| 2005/0205110 A1 * | 9/2005 | Kao et al. | 134/1.1 |
| 2005/0218507 A1 * | 10/2005 | Kao et al. | 257/704 |
| 2005/0221552 A1 * | 10/2005 | Kao et al. | 438/200 |
| 2005/0230350 A1 * | 10/2005 | Kao et al. | 216/67 |
| 2005/0271812 A1 * | 12/2005 | Myo et al. | 427/248.1 |
| 2006/0011299 A1 * | 1/2006 | Condrashoff et al. | 156/345.47 |
| 2006/0054278 A1 * | 3/2006 | Makino et al. | 156/345.27 |
| 2006/0071384 A1 * | 4/2006 | Lee et al. | 269/55 |
| 2006/0191118 A1 * | 8/2006 | Lee et al. | 29/240 |
| 2006/0292864 A1 * | 12/2006 | Yang et al. | 438/653 |
| 2007/0017445 A1 * | 1/2007 | Takehara et al. | 118/719 |
| 2007/0095285 A1 * | 5/2007 | Thakur et al. | 118/715 |
| 2007/0119370 A1 * | 5/2007 | Ma et al. | 118/723 E |
| 2007/0119371 A1 * | 5/2007 | Ma et al. | 118/723 E |
| 2007/0125515 A1 * | 6/2007 | Jung et al. | 165/46 |
| 2007/0128862 A1 * | 6/2007 | Ma et al. | 438/680 |
| 2007/0128863 A1 * | 6/2007 | Ma et al. | 438/680 |
| 2007/0128864 A1 * | 6/2007 | Ma et al. | 438/680 |
| 2007/0131167 A1 * | 6/2007 | Kodashima et al. | 118/715 |
| 2008/0044569 A1 * | 2/2008 | Myo et al. | 427/248.1 |
| 2008/0063798 A1 * | 3/2008 | Kher et al. | 427/255.394 |
| 2008/0268171 A1 * | 10/2008 | Ma et al. | 427/569 |
| 2008/0268645 A1 * | 10/2008 | Kao et al. | 438/694 |
| 2009/0078200 A1 * | 3/2009 | Lee et al. | 118/719 |
| 2009/0084316 A1 * | 4/2009 | Lee et al. | 118/719 |
| 2009/0133837 A1 * | 5/2009 | Lee et al. | 156/345.31 |

* cited by examiner

APPARATUS FOR MANUFACTURING FLAT-PANEL DISPLAY

This application is a continuation of U.S. application Ser. No. 11/064,270 filed on Feb. 23, 2005 now abandoned, the contents of which are hereby incorporated by reference.

The present application claims priority under The Paris Convention for the Protection of Industrial Property to Korean Application No. 10-2004-0012675 filed on Feb. 25, 2004, Korean Application No. 10-2004-0046667 filed on Jun. 22, 2004, Korean Application No. 10-2004-0047243 filed on Jun. 23, 2004, Korean Application No. 10-2004-0066006 filed on Aug. 20, 2004, Korean Application No. 10-2004-0069166 filed on Aug. 31, 2004, Korean Application No. 10-2004-0108225 filed on Dec. 17, 2004, Korean Application No. 10-2004-0111695 filed on Dec. 24, 2004, all of which are incorporated herein by reference.

BACKGROUND OF THE INVENTION

1. Field of the Invention

The present invention relates to an apparatus for manufacturing a flat-panel display, and, more particularly, to a flat-panel display manufacturing apparatus which has an arrangement suitable to perform desired processes for large-size substrates.

2. Description of the Related Art

Referring to FIG. 1, a general flat-panel display (FPD) manufacturing apparatus is illustrated, which is used to manufacture FPDs such as liquid crystal displays and plasma display panels (PDPs). As shown in FIG. 1, the FPD manufacturing apparatus, which is designated by reference numeral 1, includes a load lock chamber 100, a feeding chamber 200, and a processing chamber 300, which are connected in series. A gate valve G is arranged between adjacent ones of the chambers, in order to independently maintain a vacuum atmosphere in each chamber.

The load lock chamber 100 is connected to an external station, in order to receive a substrate to be processed in the FPD manufacturing apparatus for loading of the substrate or to discharge a substrate completely processed in the FPD manufacturing apparatus for unloading of the substrate. The load lock chamber 100 is repeatedly switched between a vacuum state and an atmospheric state, so that the load lock chamber 100 is selectively communicated with the external station. A loading die 102 is arranged in the load lock chamber 100, in order to load one or more substrates on the loading die 102.

Aligners 106 are arranged around the loading die 102, in order to correct the position of a substrate S load on the loading die 102, as shown in FIG. 1. The aligners 106 correct the position of the substrate S by diagonally pushing the sides of the substrate S loaded on the loading die 102. An exhausting device (not shown) and a gas supplier (not shown) are also installed in the load lock chamber 100, in order to change the atmosphere of the load lock chamber 100 between a vacuum state and an atmospheric state.

The feeding chamber 200 is connected between the load lock chamber 100 and the processing chamber 300. The feeding chamber 200 is provided with a feeding robot 202 arranged in the interior of the feeding chamber 200, so that the feeding chamber 200 serves as an intermediate passage for feeding a substrate between the load lock chamber 100 and the processing chamber 300 for loading/unloading of the substrate. The feeding chamber 200 is maintained in a vacuum atmosphere, so that the processing chamber 300 is maintained in a vacuum atmosphere.

The processing chamber 300 is equipped with a loading die 302 to load a substrate in the processing chamber 300, and a processing device (not shown) to perform a desired process for the substrate loaded in the processing chamber 300. For example, an etch process is carried out in a vacuum atmosphere established in the processing chamber 300.

Such an FPD manufacturing apparatus may be of a cluster type in which a plurality of processing chambers 300 are connected to a single feeding chamber 200, as shown in FIG. 2. In this case, the feeding chamber 200 may have a circular or polygonal shape such that a plurality of processing chambers 300 are arranged around the feeding chamber 200.

Meanwhile, recently-developed FPD manufacturing apparatuses include vacuum chambers having an extremely large size, for example, a width of 3 m or more, in order to process substrates having a large size of 2 m or more. For this reason, there is a problem in transporting such vacuum chambers from a manufacturing place thereof to an installation place thereof. In other words, such a vacuum chamber, which has a width of 3 m or more, cannot be transported by land, taking into consideration the road conditions of Korea and other foreign countries.

Furthermore, where such a large-size vacuum chamber is manufactured in the form of a single body, it is necessary to use a large-size machining device for the machining of a metal material to form an outer housing of the vacuum chamber. In addition, the machining process is also difficult.

Also, when it is necessary to repair structures installed in the interior of the vacuum chamber, in order to eliminate various problems generated during operation of the vacuum chamber, the top of the vacuum chamber must be opened. Where the vacuum chamber is manufactured in the form of a single body, however, it is difficult to open the top of the vacuum chamber. Furthermore, much labor is required. For this reason, it is impossible to easily repair the vacuum chamber.

Due to an increase in chamber size, the footprint of the vacuum chamber in a clean room is also greatly increased. Therefore, it is necessary to provide an FPD manufacturing apparatus capable of efficiently processing large-size substrates without an increase in footprint.

SUMMARY OF THE INVENTION

It is an object of the invention to provide an FPD manufacturing apparatus which is capable of easily processing large-size substrates while achieving easy manufacturing, transporting, operating, and repair processes.

In accordance with one aspect, the present invention provides a separable vacuum chamber of a flat-panel display manufacturing apparatus comprising: a top plate forming a top of the chamber; a bottom plate facing the top plate and forming a bottom of the chamber; a peripheral wall plate coupled, at upper and lower ends thereof, to the top plate and the bottom plate, respectively, to define a closed space, the peripheral wall plate having, at an end thereof connected to the bottom plate, an extension extending in a peripheral direction of the chamber inside the chamber to form a step on the bottom plate; a cover member arranged on the bottom plate to extend in the peripheral direction of the chamber inside the chamber such that the cover member covers the extension of the peripheral wall plate; and seal members interposed between the extension and the cover member and between the bottom plate and the cover member to shield the closed space from an outside of the chamber.

In accordance with another aspect, the present invention provides a separable vacuum chamber of a flat-panel display manufacturing apparatus comprising: a top plate forming a top of the chamber; a bottom plate facing the top plate and forming a bottom of the chamber; a peripheral wall plate coupled, at upper and lower ends thereof, to the top plate and the bottom plate, respectively, to define a closed space, the peripheral wall plate having, at an end thereof connected to the top plate, an extension extending in a peripheral direction of the chamber inside the chamber to form a step on the top plate; a cover member arranged on the top plate to extend in the peripheral direction of the chamber inside the chamber such that the cover member covers the extension of the peripheral wall plate; and seal members interposed between the extension and the cover member and between the top plate and the cover member to shield the closed space from an outside of the chamber.

In accordance with another aspect, the present invention provides a separable vacuum chamber used in manufacturing flat-panel displays, comprising: a chamber housing divided into at least two sections, wherein the vacuum chamber is formed by assembling the chamber housing sections, together with elements to be arranged in the vacuum chamber.

In accordance with another aspect, the present invention provides a flat-panel display manufacturing apparatus comprising a plurality of chambers each adapted to perform a required process for a substrate, wherein at least one of the chambers comprises: a chamber housing having a gateway formed at a top of the chamber housing; a top cover mounted to the top of the chamber housing to open/close the gateway, and provided with one or more openings formed through the top cover in a thickness direction of the top cover; one or more auxiliary covers each mounted to the top cover to open/close an associated one of the one or more openings; and one or more seal members each interposed between the top cover and an associated one of the one or more auxiliary covers to provide a sealing effect between the top cover and the associated auxiliary cover.

In accordance with another aspect, the present invention provides a flat-panel display manufacturing apparatus comprising a load lock chamber, a feeding chamber, and a processing chamber, to manufacture flat-panel displays, wherein the load lock chamber comprises: a vacuum chamber housing, in which vacuum can be established; an opening formed through a peripheral wall of the vacuum chamber housing to allow a substrate to pass through the opening for loading of the substrate into the vacuum chamber housing and unloading of the substrate from the vacuum chamber housing; a gate valve adapted to open/close the opening; and end effecter receiving grooves formed at a bottom wall of the vacuum chamber housing to receive end effectors of a substrate feeding robot installed outside the load lock chamber, respectively, each of the end effecter receiving grooves having a predetermined depth to allow an associated one of the end effectors to move vertically in the end effecter receiving groove.

In accordance with another aspect, the present invention provides a method for loading a substrate in a load lock chamber, comprising the steps of: A) opening an opening of the load lock chamber, and inserting a substrate into the load lock chamber by use of a substrate feeding robot while inserting end effecters of the feeding robot into end effecter receiving grooves of the load lock chamber; B) lowering the end effecters of the feeding robot in the end effecter receiving grooves, thereby loading the substrate in the load lock chamber; C) horizontally moving the feeding robot, thereby ejecting the feeding robot from the load lock chamber; and D) closing the opening, and establishing a vacuum atmosphere in the load lock chamber.

In accordance with another aspect, the present invention provides a flat-panel display manufacturing apparatus comprising a load lock chamber, a feeding chamber, and a processing chamber, wherein the feeding chamber comprises: a feeding robot comprising a feeding arm arranged at a lower portion of the feeding chamber, and a driver coupled to a lower end of the feeding arm, and seated on a bottom of the feeding chamber; a vertical driver arranged beneath the feeding chamber, and adapted to lift the feeding robot to a level of a door; a driver gateway formed at one side of the feeding chamber to allow the driver to pass through the driver gateway; and the door mounted to the feeding chamber to open/close the driver gateway.

In accordance with another aspect, the present invention provides a flat-panel display manufacturing apparatus comprising an electric field generating system, a processing gas supplying system, and an exhausting system, which are arranged in a vacuum chamber, to perform a required process for a substrate loaded in the vacuum chamber, wherein the vacuum chamber comprises: a chamber body forming a side wall of the vacuum chamber; a top cover coupled to a top portion of the chamber body to form a top wall of the vacuum chamber; and a bottom cover coupled to a bottom portion of the chamber body to form a bottom wall of the vacuum chamber, wherein the chamber body is provided, at a lower end thereof, with an engagement rim horizontally inwardly protruded from the lower end of the chamber body to be engaged with the bottom cover, wherein the lower cover is provided, at a peripheral edge thereof, with an engagement groove having a shape conforming to the engagement rim.

In accordance with another aspect, the present invention provides a method for repairing a flat-panel display manufacturing apparatus, comprising the steps of: A) separating a top cover from a chamber body by a feeding device; B) separating a bottom cover from the chamber body by the feeding device, and laying the bottom cover on a working die; C) repairing the bottom cover; D) coupling the bottom cover to the chamber body by the feeding device; and E) coupling the top cover to the chamber body by the feeding device.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Figure 1:
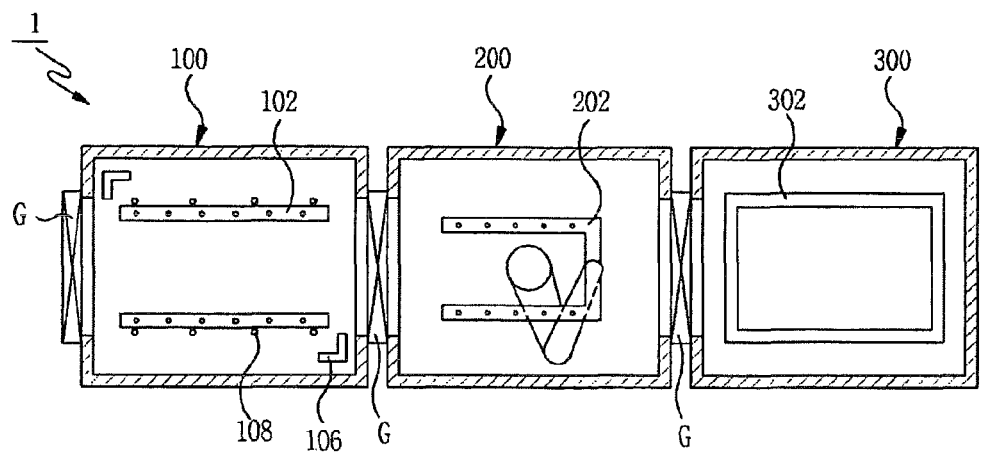
FIG. 1 is a schematic view illustrating a layout of a general FPD manufacturing apparatus.
Figure 2:
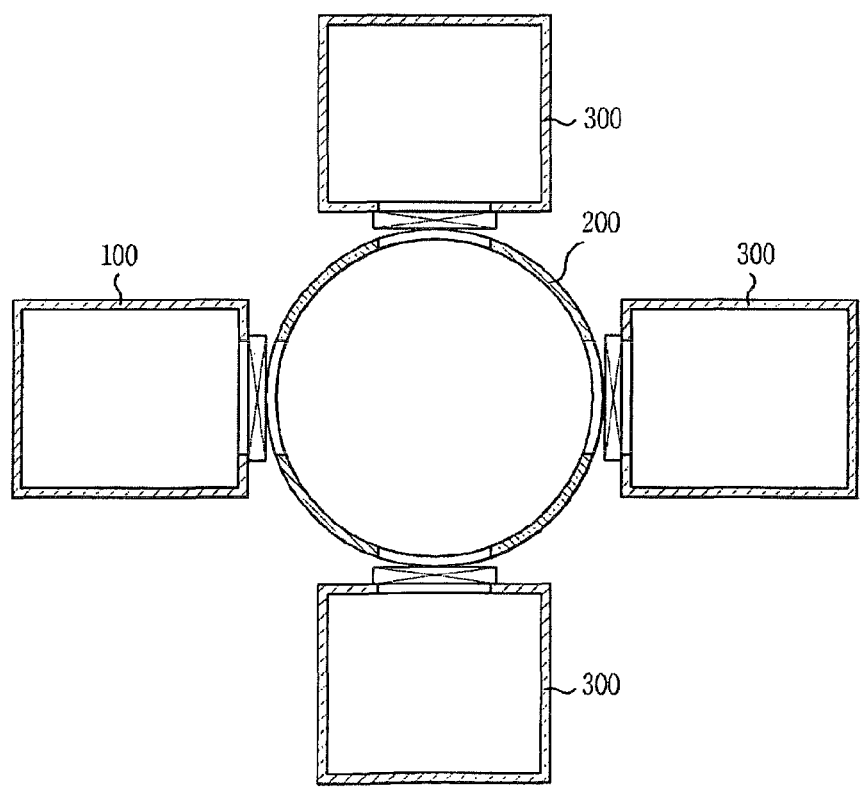
FIG. 2 is a schematic view illustrating a layout of another general FPD manufacturing apparatus.

Hereinafter, exemplary embodiments of the present invention will be described with reference to the annexed drawings. In the following description, elements respectively corresponding to those in FIGS. 1 and 2 will be designated by the same reference numerals.

First Embodiment

Figure 3:
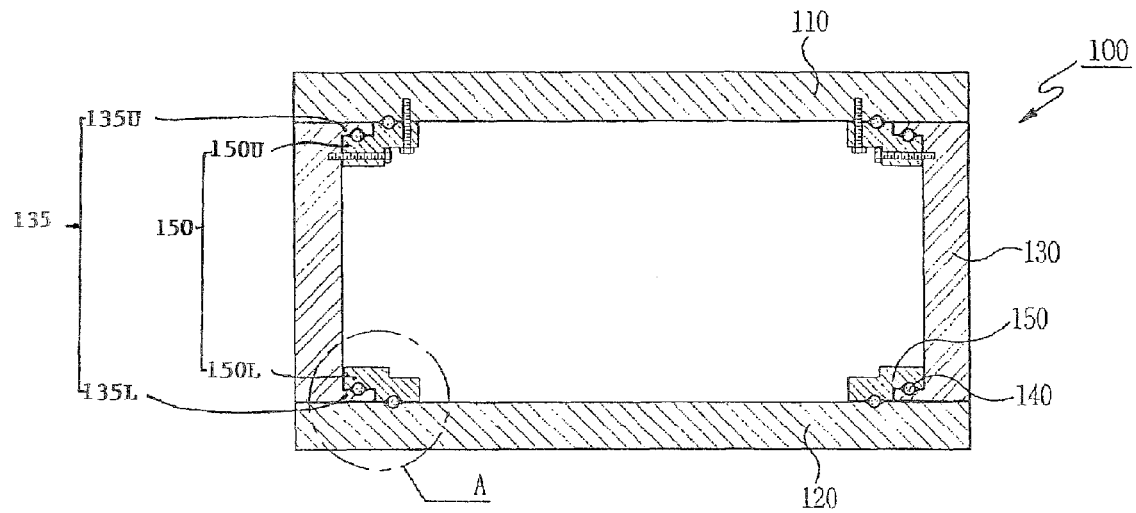
FIG. 3 is a front view illustrating a separable vacuum chamber according to a first embodiment of the present invention.
Figure 4A:
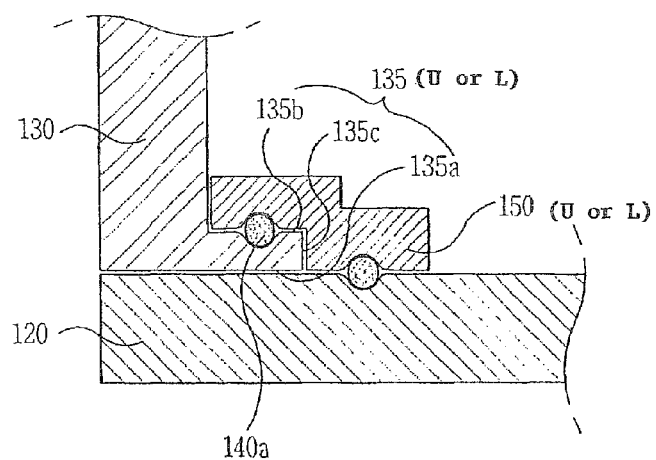
FIGS. 4a and 4b are enlarged views corresponding to a portion "A" of FIG. 3, respectively.
Figure 4B:
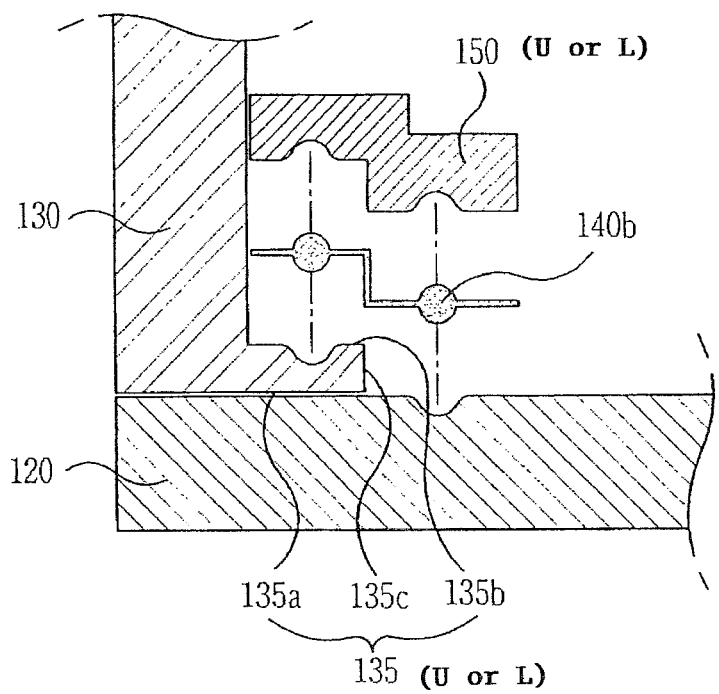

FIG. 3 is a front view illustrating a separable vacuum chamber included in an FPD manufacturing apparatus according to a first embodiment of the present invention. FIGS. 4a and 4b are enlarged views corresponding to a portion "A" in FIG. 3, respectively. Although the illustrated vacuum chamber is applicable to any one of a load lock chamber, a feeding chamber, and a processing chamber, the following description will be given only in conjunction with the case in which the vacuum chamber is applied to a load lock chamber, for convenience of description.

As shown in FIG. 3, the separate vacuum chamber according to this embodiment, which is designated by reference numeral 100, includes a top plate 110 and a bottom plate 120, which face each other to define the top and bottom of the chamber 100, respectively, and a peripheral wall plate 130 coupled, at upper and lower ends thereof, to the top plate 110 and bottom plate 120, respectively. Extensions 135 are formed at the upper and lower ends of the peripheral wall plate 130 such that the extensions 135 extend along the top plate 110 and bottom plate 120 inside the vacuum chamber 100, thereby forming steps on the top plate 110 and bottom plate 120, respectively, as shown in FIGS. 3, 4a and 4b. Although two extensions 135, an upper extension 135U and a lower extension 135L, are arranged at both ends of the peripheral wall plate 130, respectively, in the illustrated case, a single extension 135 may be formed only at one end of the peripheral wall plate 130.

Thus, each of the extensions 135 extends from one end or each end of the peripheral wall plate 130 along an inner surface of the vacuum chamber 100 to form a step at the top plate 110, bottom plate 120, or each of the top and bottom plates 110 and 120, as shown in FIG. 4a. Each extension 135 has three surfaces, that is, an outer surface or contact surface 135a contacting the top plate 110 or bottom plate 120, an inner surface 135b, and an end surface 135c.

In order to shield the interior of the chamber 100 from the outside of the chamber 100, and thus, to effectively maintain the interior of the chamber 100 in a vacuum state, seal members 140 are arranged at the steps of the top plate 110, bottom plate 120, or both the top and bottom plates 110 and 120, respectively, as shown in FIG. 3. Cover members 150 are also arranged at the steps of the top plate 110 (upper cover member 150U), bottom plate 120 (lower cover member 150L), or both the top and bottom plates 110 and 120, respectively, to cover the extensions 135 under the condition in which each seal member 140 is interposed between an associated one of the steps and an associated one of the cover members 150. Each cover member 150 is in contact with surfaces defining the associated step, that is, the surface portion of the associated extension 135, the surface portion of the peripheral wall plate 130 formed with the extension 135, and the surface portion of the top plate 110 or bottom plate 120 contacting the extension 135.

Each cover member 150 minimizes exposure of an associated one of the seal members 140 to plasma gas present in the chamber 100, and thus, protects the associated seal member 140. Preferably, each cover member 150 is in close contact with the peripheral wall plate 130 and the associated top plate 110 or bottom plate 120 while covering the associated seal member 140. In the case of the cover member 150, which is coupled to the bottom plate 120, this coupling may be simply achieved, using the weight of the cover member 150, as shown in FIG. 4a. However, it is preferred that the coupling of the cover member 150 to the bottom plate 120 be achieved, using fastening members such as screws or bolts, in order to obtain a higher coupling force. On the other hand, in the case of the cover member 150, which is coupled to the top plate 110, this coupling must be achieved, using fastening members such as screws or bolts, as shown in FIG. 3, in order to prevent the cover member 150 from being separated from the top plate 110 by the weight of the cover member 150.

As shown in FIGS. 3 and 4a, each seal member 140 may comprise O-rings, which may be typically used in a general vacuum chamber. In accordance with the illustrated embodiment of the present invention, each seal member 140 comprises a pair of O-rings 140a respectively arranged on the associated extension 135 and the top plate 110 or bottom plate 120 where the extension 135 is arranged.

The O-rings 140a of each seal member 140 may be separate from each other or integral with each other. In the case of FIG. 4a, the O-rings 140a of each seal member 140 are arranged on the associated extension 135 and a portion of the top plate 110 or bottom plate 120 positioned near the end surface 135c of the extension 135, respectively, while being separate from each other. On the other hand, in the case of FIG. 4b, each seal member 140 comprises a pair of O-rings 140b respectively arranged on the associated extension 135 and the portion of the top plate 110 or bottom plate 120 positioned near the end surface 135c of the extension 135, respectively, while being integral with each other. Where the seal members 140, each of which comprises the O-rings 140b having an integral structure as shown in FIG. 4b, are used, it is possible to more effectively maintain the chamber 100 in a vacuum state.

Although each seal member 140 has been described as comprising a pair of O-rings 140a or 140b respectively arranged on the inner surface 135b of the associated extension 135 and the top plate 110 or bottom plate 120, where the extension 135 is arranged, while being separate from each other or integral with each other, as shown in FIG. 4a or 4b, the seal member 140 may have a structure in which the O-ring 140a or 140b, which is adapted to be arranged on the extension 135, is not arranged on the inner surface 135b of the extension 135, but is arranged at the end surface 135c of the extension 135, if necessary.

In order to manufacture the separable vacuum chamber 100, the bottom plate 120, which constitutes the bottom of the chamber 100, is first installed at a desired place. For simplification of description, the following description will be given only in conjunction with an assembly process carried out at one side of the chamber 100 where seal members 140 each having a separate O-ring structure are used. Thereafter, one O-ring 140a of one seal member (lower seal member) 140 is laid on the bottom plate 120. In order to place the O-ring 140a in position on the bottom plate 120, it is preferred that a seat, which is adapted to receive a portion of the O-ring 140a, be formed at a portion of the bottom plate 120 where the O-ring 140a will be placed.

After the placement of the O-ring 140a on the bottom plate 120, the peripheral wall plate 130 is installed on the bottom plate 120 such that the outer surface 135a of the lower extension 135, which is formed at the lower end of the peripheral wall plate 130, comes into contact with the bottom plate 120, as shown in FIG. 4a. As a result, a lower step is formed on the bottom plate 120. Since no O-ring is interposed between the bottom plate 120 and the lower end surface of the peripheral wall plate 130, contrary to conventional cases, it is unnecessary to form a seat adapted to receive a portion of the O-ring, at the lower end surface of the peripheral wall plate 130 contacting the bottom plate 120.

After the installation of the peripheral wall plate 130 on the bottom plate 120, the other O-ring 140a of the lower seal member 140 is laid on the inner surface 135b of the lower extension 135 formed at the lower end of the peripheral wall plate 130, as shown in FIG. 4a. In order to place the other O-ring 140a in position on the lower extension 135, a seat, which is adapted to receive a portion of the other O-ring 140a, is formed at the inner surface 135b of the lower extension 135. Accordingly, the other O-ring 140a is laid on the seat formed at the inner surface 135b of the lower extension 135.

Thereafter, one cover member 150 (in this example, the lower cover member 150L) is arranged at the lower step such that the lower cover member 150 comes into contact with the peripheral wall plate 130 and bottom plate 120 under the condition in which the lower cover member 150 covers the O-rings 140 of the lower seal member 140 respectively laid on the upper surface of the bottom plate 120 and the inner surface 135b of the lower extension 135. The lower surface of the lower cover member 150 has a particular shape such that the lower surface comes into contact with the extension 135 forming the lower step, and thus, engages with the extension 135. The lower surface of the lower cover member 150 is also formed with seats to partially receive the O-ring 140a arranged on the inner surface 135b of the extension 135 and the O-ring 140a arranged on the upper surface of the bottom plate 120, respectively. Thereafter, the lower cover member 150 is fastened to the bottom plate 120 by means of fastening members such as bolts or screws, in order to firmly couple the lower cover member 150 to the bottom plate 120, and thus, to prevent movement of the lower cover member 150, and to protect the O-rings 140a.

Thus, the lower structure of the chamber 100 is completely formed in accordance with the above-described assembly process. Using the same assembly process as the above-described assembly process, the upper structure of the chamber 100 is then formed. That is, the assembly process is carried out in the order of laying the top plate 110 on the peripheral wall plate 130, arranging the upper seal member 140, and then coupling the upper cover member 150.

Second Embodiment

In accordance with this embodiment, at least one of the load lock chamber, feeding chamber, and processing chamber, which constitute an FPD manufacturing apparatus, has a vertically-stacked chamber structure including at least two sub chambers each coupled to one another, using various protrusion/groove type structures. In accordance with this embodiment, it is possible to provide an FPD manufacturing apparatus capable of achieving an optimal space efficiency, and thus, achieving a cost reduction and an increase in productivity, while obtaining a desired rigidity of the stacked chamber. Accordingly, this embodiment meets recent requirements to develop an FPD manufacturing apparatus capable of manufacturing large-size FPDs while exhibiting an increased productivity without an increase in the installation area caused by an increase in FPD manufacturing apparatus size.

Although the stacked chamber according to this embodiment is applicable to any one of the load lock chamber, feeding chamber, and processing chamber, the following description will be given only in conjunction with the case in which the stacked chamber is applied to the processing chamber, for convenience of description.

Figure 5:
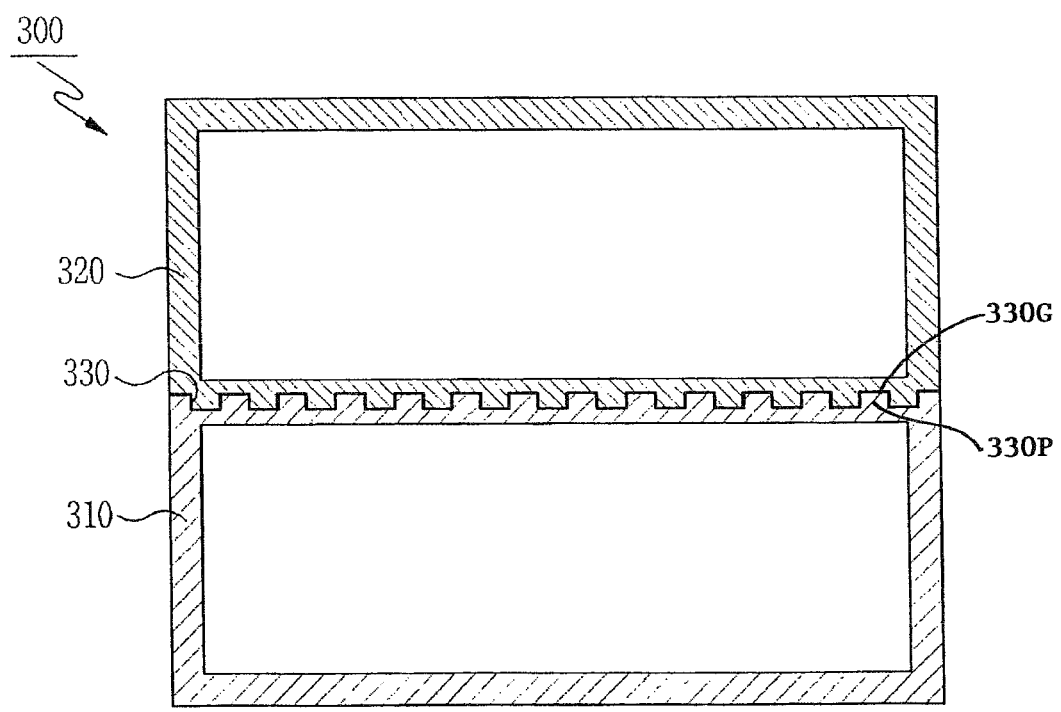
FIG. 5 is a front view illustrating a structure of a stacked chamber included in an FPD manufacturing apparatus according to a second embodiment of the present invention.

FIG. 5 is a front view illustrating a structure of the stacked chamber included in the FPD manufacturing apparatus according to the second embodiment of the present invention.

As shown in FIG. 5, the processing chamber 300 included in the FPD manufacturing apparatus includes at least two vertically-stacked sub chambers. In the illustrated case, the processing chamber 300 includes two vertically-stacked sub chambers 310 and 320. In order to manufacture FPDs, the FPD manufacturing apparatus generally includes a load lock chamber, a feeding chamber, and a processing chamber. Taking into consideration process and space efficiencies, the chambers of the FPD manufacturing apparatus may have a stacked structure. That is, one, two or all of the three chambers, which constitute the FPD manufacturing apparatus, may have a stacked structure.

Meanwhile, in the FPD manufacturing apparatus, the substrate processing time taken in the processing chamber is longest, as compared to the substrate processing times taken in the remaining chambers. Also, the processing chamber performs a great number of functions. For this reason, it is preferred that the processing chamber include a certain number of vertically-stacked sub chambers, in order to achieve an enhancement in substrate processing efficiency.

For example, the processing chamber may include two vertically-stacked sub chambers. In this case, the load lock chamber and feeding chamber are driven to externally unload a substrate completely processed in one sub processing chamber and to load another substrate, to be processed, in the sub processing chamber while a certain process is carried out for another substrate in the other sub processing chamber. Thus, processes for substrates in both the sub processing chambers can be efficiently carried out.

The number of vertically-stacked sub chambers may be two or more. Where two sub chambers are used, they may perform the same function or different functions, respectively.

In the illustrated case, the processing chamber 300 of the FPD manufacturing apparatus includes two vertically-stacked sub chambers 310 and 320, which are coupled to each other, using protrusion type engagement structures 330P and groove type engagement structures 330G respectively and alternately formed at contact portions 330 of the sub chambers 310 and 320. Where the sub chambers 310 and 320 are coupled to each other, using the protrusion/groove type engagement structures 330P/330G respectively formed at the contact portions 330 of the sub chambers 310 and 320, there is an advantage in that the overall height of the processing chamber 300 is reduced, as compared to the case in which the coupling of the sub chambers 310 and 320 is achieved without using the protrusion/groove type engagement structures 330P/330G respectively formed at the contact portions 330.

Furthermore, where the coupling of the sub chambers 310 and 320 is achieved without using the protrusion/groove type engagement structures 330P/330G respectively formed at the contact portions 330, the sub chambers 310 and 320 may move with respect to each other. Of course, such movement may be prevented by coupling the contact portions of the sub chambers 310 and 320 by means of a soldering process. In this case, however, it is difficult to separate the sub chambers from each other when it is desired to replace one of the sub chambers with a new one. However, where the contact portions of the sub chambers 310 and 320 are coupled with each other using the above-described protrusion/groove type engagement structures, it is possible to firmly couple the sub chambers 310 and 320 without any movement thereof, and to easily separate the sub chambers 310 and 320 when it is desired to replace one of the sub chambers with a new one.

FIGS. 6a to 6d are schematic views respectively illustrating various protrusion/groove type engagement structures 330P/330G formed at the contact portions 330 of the sub chambers 310 and 320 in order to firmly couple the sub chambers 310 and 320 and to optimize the overall height of the processing chamber 300.

Figure 6:
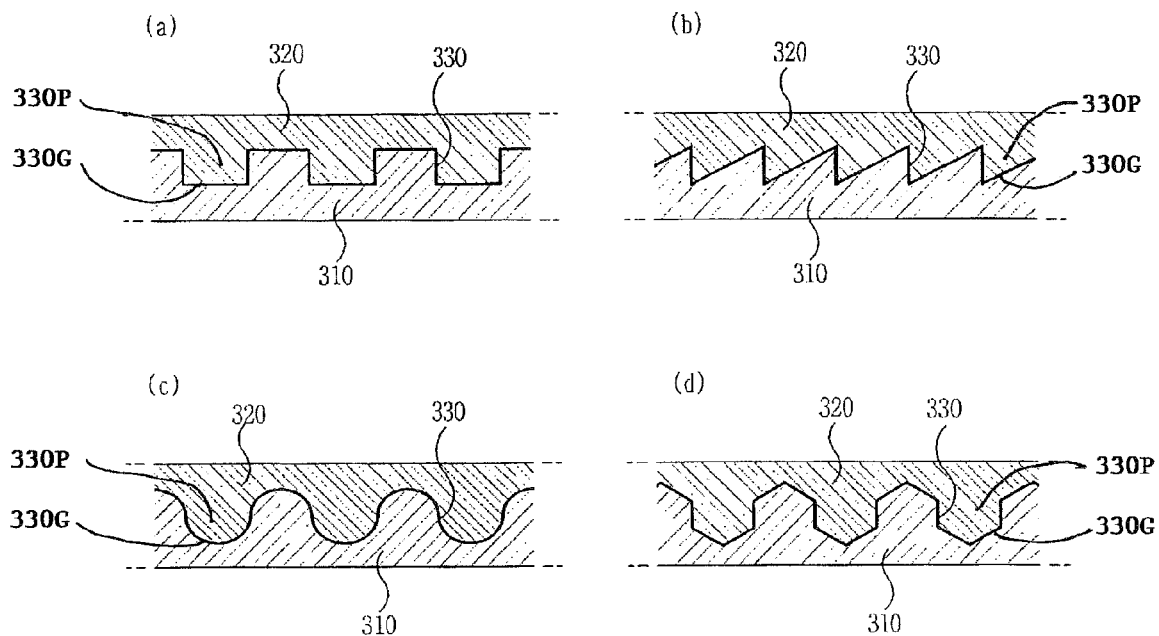
FIGS. 6a to 6d are schematic views respectively illustrating various protrusion/groove type engagement structures applied to the stacked chamber of FIG. 5.

FIG. 6a shows rectangular protrusion/groove type engagement structures 330P/330G, FIG. 6b shows right-angled triangular protrusion/groove type engagement structures 330P/330G, FIG. 6c shows semicircular protrusion/groove type engagement structures 330P/330G, and FIG. 6d shows polygonal protrusion/groove type engagement structures 330P/330G. In accordance with such protrusion/groove type engagement structures 330P/330G, the contact portions 330 of the sub chambers 310 and 320 are firmly engaged with each other, so that the sub chambers 310 and 320 are firmly coupled to each other to be prevented from moving with respect to each other. On the other hand, when it is desired to separate the sub chambers 310 and 320 from each other, this separation can be easily achieved by simply vertically moving the upper sub chamber 320 away from the lower sub chamber 310.

The protrusion/groove type engagement structure 330P/330G may have various shapes to achieve easy coupling of the sub chambers 310 and 320, and to reduce the overall height of the chamber 300. Preferably, the protrusions and grooves of the protrusion/groove type engagement structure 330P/330G may have one selected from a rectangular shape, a right-angled triangular shape, a semicircular shape, and a polygonal shape.

As described above, the sub chambers 310 and 320 of the chamber 300 having the above-described vertically-stacked structure may perform the same function or may perform different functions, respectively. Accordingly, it is possible to achieve an optimal space efficiency, and thus, an enhancement in productivity, and to obtain an enhanced process efficiency.

As described above, it is possible to achieve an enhancement in process efficiency by constituting at least one of the load lock chamber, feeding chamber, and processing chamber of the FPD manufacturing apparatus by at least two sub chambers, which are vertically stacked. Also, the sub chambers are engaged with each other, using the protrusion/groove type engagement structures 330P/330G formed at respective contact portions of the sub chambers, so that the sub chambers have firmness and easy separability. The processing chamber has a reduced overall height, thereby achieving an optimal space efficiency.

Third Embodiment

In accordance with this embodiment, a vacuum chamber having a separable structure to achieve easy manufacturing, transporting, and repair processes is provided, which is used to manufacture FPDs. For the separable structure, the vacuum chamber includes a chamber housing divided into at least two sections. Thus, the separable vacuum chamber is formed by assembling the chamber housing sections, together with elements to be arranged in the vacuum chamber.

Although the separable vacuum chamber according to this embodiment is applicable to any one of the load lock chamber, feeding chamber, and processing chamber, the following description will be given only in conjunction with the case in which the separable vacuum chamber is applied to the feeding chamber, for convenience of description.

Figure 7:
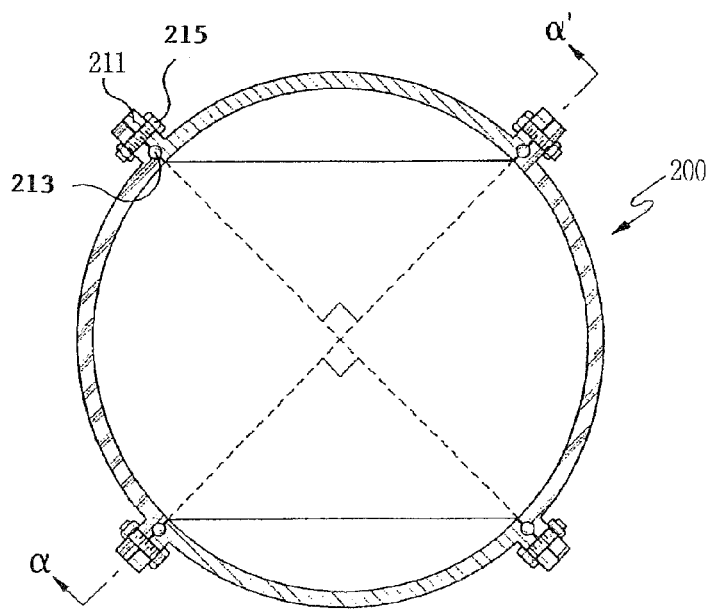
FIG. 7 is a plan view illustrating a coupled state of a separable vacuum chamber according to a third embodiment of the present invention.

Preferably, the separable vacuum chamber according to this embodiment is applied to the feeding chamber 200, which functions to feed a substrate between the load lock chamber 100 and the processing chamber 300, as shown in FIG. 7. The feeding chamber 200 requires an inner space wider than those of the load lock chamber and processing chamber, in order to allow free movements of elements arranged in the feeding chamber 200, such as a feeding robot. As a result, the feeding chamber 200 may more severely encounter problems incurred in the case in which it is required to process large-size substrates. For example, although the size of the feeding chamber 200 must be sufficiently increased in such a case, it may be impossible to transport the feeding chamber having such a size. In order to solve such a problem, it is desirable to transport the feeding chamber under the condition in which the feeding chamber is divided into a plurality of chamber portions. For this reason, it is preferred that the separable chamber structure according to this embodiment be mainly applied to the feeding chamber.

It is also preferred that the separable vacuum chamber 200 have a circular shape when viewing from the top of the separable vacuum chamber 200, as shown in FIG. 7. In order to arrange a large number of processing chambers around the feeding chamber, it is desirable for the feeding chamber to have a circular shape, as compared to a rectangular shape or a polygonal shape such as a hexagonal shape. Where the feeding chamber has a circular shape, it is possible to freely form a desired number of processing chambers. Thus, in accordance with the present invention, it is preferred that the cross-sectional shape of the separable vacuum chamber 200 parallel to the ground have a circular shape.

Figure 8:
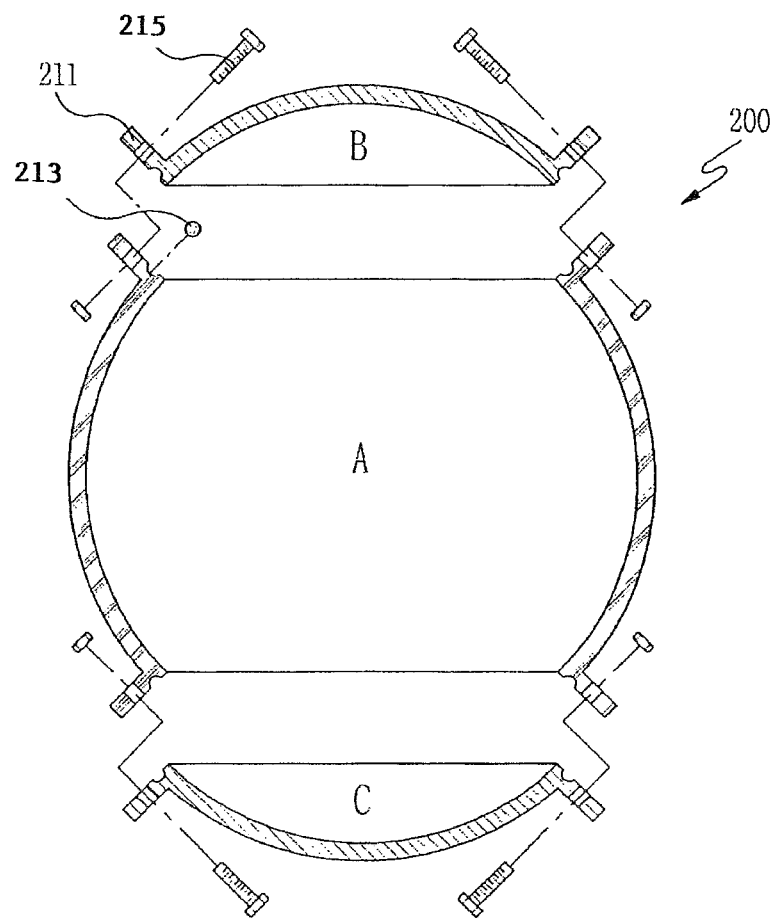
FIG. 8 is a plan view illustrating an exploded state of the separable vacuum chamber according to the third embodiment of the present invention.

It is also preferred that the separable vacuum chamber 200 be divided into three sections A, B, and C, as shown in FIG. 7 or 8. In this case, it is also preferred that the chamber sections B and C have an arc shape having a central angle of 90°±10°, while facing each other. In this case, accordingly, the arc length of each chamber sections B or C is similar to the width of the intermediate section A.

Figure 9:
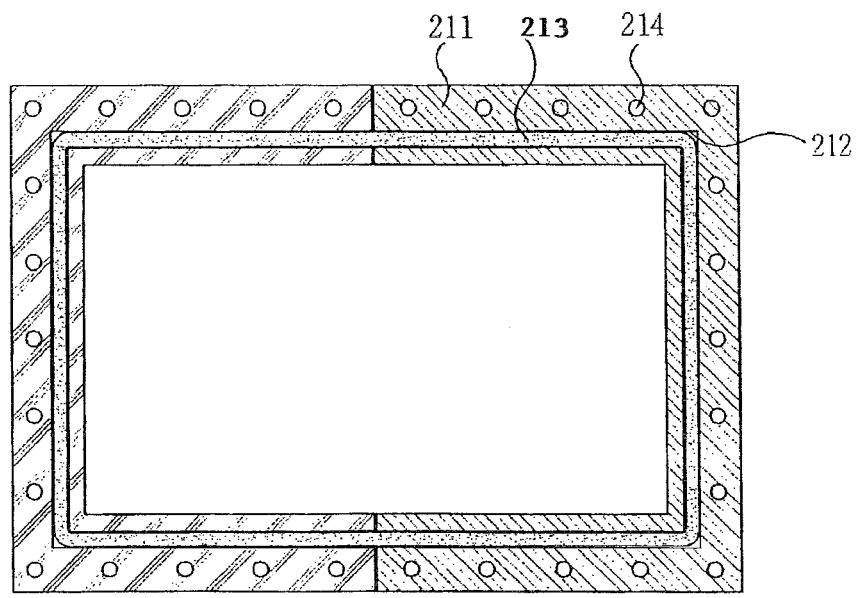
FIG. 9 is an elevation view illustrating structures of coupling surfaces of vacuum chamber sections according to the third embodiment of the present invention.

As shown in FIG. 9, a seal member receiving groove 212 is formed at the coupling surface of each chamber section. A clamper 211 also extends radially outwardly from each coupling end of each chamber section, in order to firmly couple adjacent ones of the chamber sections.

Each seal member receiving groove 212 has a desired depth, and extends along the coupling surfaces of the associated chamber sections. Adjacent ones of the chamber sections are coupled to each other under the condition in which one seal member 213 is interposed between the seal member receiving grooves 212 of the adjacent chamber sections.

Where a vacuum chamber is formed by coupling the above-described chamber sections under the condition in which each seal member 213 is interposed between the seal member receiving grooves 212 formed at the facing coupling surfaces of adjacent chamber sections, it is possible to prevent ambient air from entering the vacuum chamber along the coupling surfaces and to prevent gas present in the vacuum chamber from leaking outwardly from the vacuum chamber. Thus, the seal members 213 function to seal the vacuum chamber.

Preferably, each seal member 213 extends continuously along the coupling surfaces of the associated chamber sections, and is made of an elastic material such that the seal member 213 is slightly elastically compressed by the chamber sections when the chamber sections are coupled to each other.

The clampers 211 function to firmly fasten the chamber sections of the vacuum chamber. In particular, the slight elastic compression of the seal members 213 can be achieved only when the chamber sections of the vacuum chamber are fastened by the clampers 211. Thus, the coupling surfaces of the adjacent chamber sections can be completely sealed by the function of the clampers 211.

Figure 10:
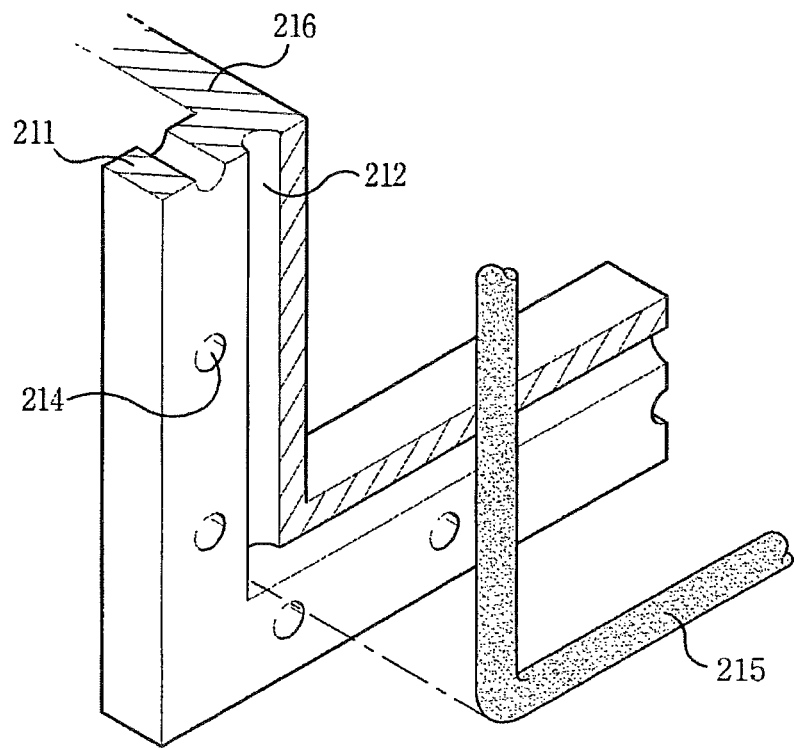
FIG. 10 is a perspective view illustrating the structures of the coupling surfaces of the vacuum chamber sections according to the third embodiment of the present invention.

As shown in FIG. 10, each clamper 211 is radially outwardly protruded from an associated lateral end of the associated chamber section. A plurality of uniformly-spaced clamping holes 214 are formed through each clamper 211. That is, each clamper 211 extends radially outwardly from the associated lateral end of the associated chamber section such that the clamper 211 forms an extension surface connected to the associated coupling surface of the associated chamber section. Each clamper 211 has a desired thickness. The clamping holes 214 of each clamper 211 extend throughout the thickness of the clamper 211 while being uniformly spaced apart from one another along the clamper 211. Each clamping hole 214 is formed, at an inner surface thereof, with female threads adapted to be threadedly coupled with a clamping bolt 215.

As shown in FIG. 7 or 8, when adjacent ones of the chamber sections are to be coupled to each other, the clamping bolts 215 are threadedly coupled with the clamping holes 214 of the adjacent chamber sections, thereby firmly coupling the chamber sections.

Fourth Embodiment

This embodiment provides an FPD manufacturing apparatus in which at least one of the vacuum chambers included in the FPD manufacturing apparatus includes a top cover having a divided structure, that is, including a detachable auxiliary cover, in order to achieve easy transportation of the vacuum chamber.

Although the vacuum chamber according to this embodiment is applicable to any one of the load lock chamber, feeding chamber, and processing chamber, the following description will be given only in conjunction with the case in which the vacuum chamber is applied to the feeding chamber, for convenience of description.

Figure 11:
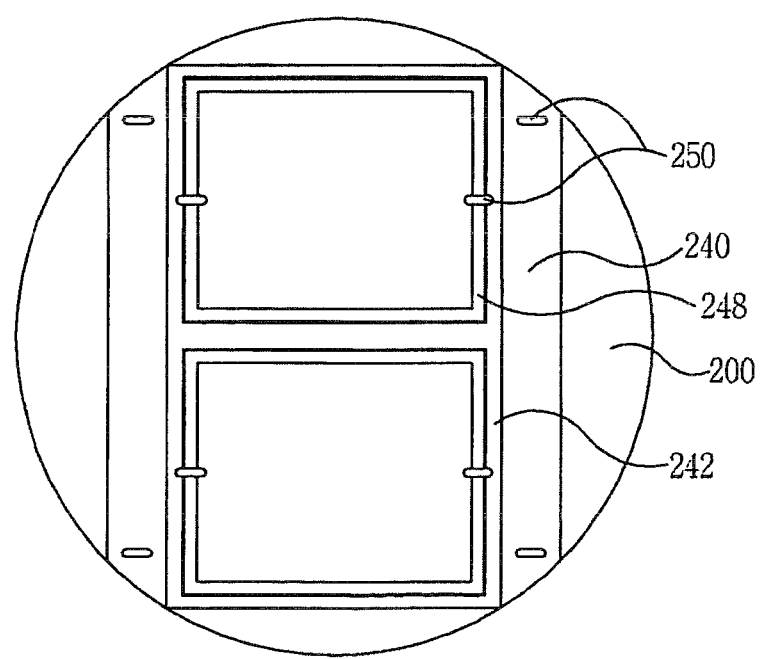
FIG. 11 is a plan view schematically illustrating a coupled state of a top cover and auxiliary covers to a feeding chamber included in an FPD manufacturing apparatus according to a fourth embodiment of the present invention.
Figure 12:
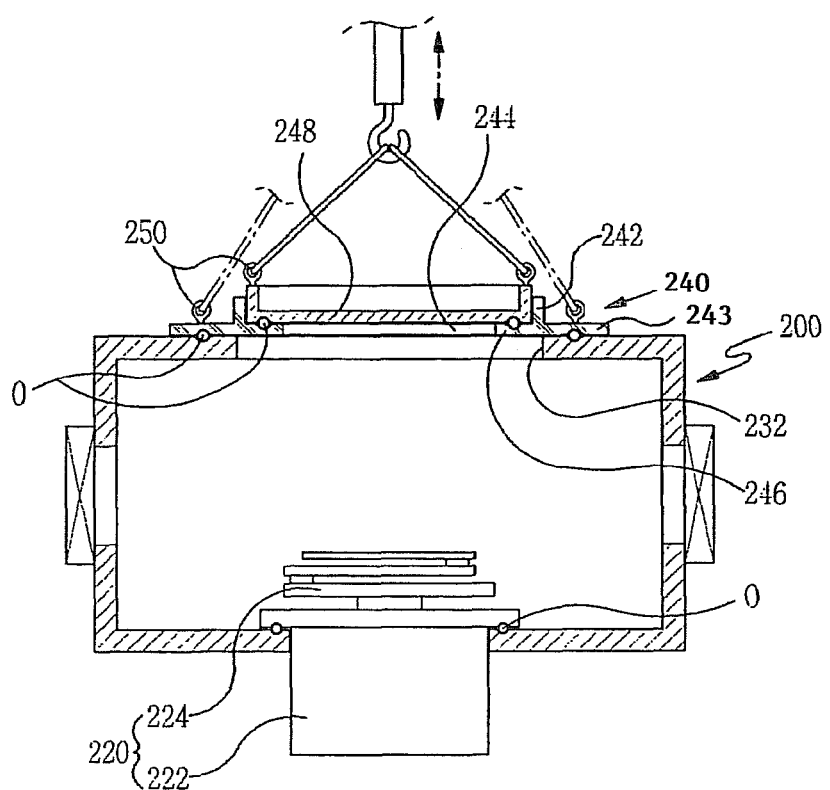
FIG. 12 is a transversal sectional view corresponding to FIG. 3.

As shown in FIGS. 11 and 12, the feeding chamber 200 of the FPD manufacturing apparatus according to this embodiment includes a feeding robot gateway 232 formed at the top of the feeding chamber 200 to allow a feeding robot 220 arranged in the feeding chamber 200 to move outwardly from the interior of the feeding chamber 200, for repair or replacement of the feeding robot 220. The feeding chamber 200 also includes a top cover 240 to open and close the feeding robot gateway 232.

Figure 13:
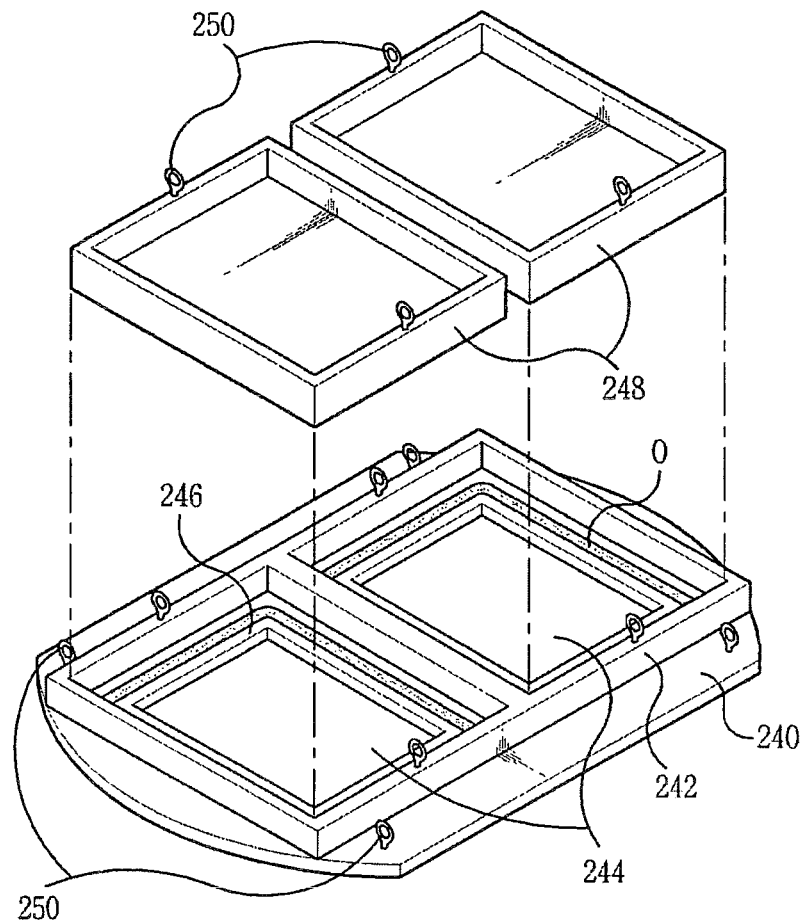
FIG. 13 is an exploded perspective view illustrating the top cover and auxiliary covers arranged at the top of the feeding chamber included in the FPD manufacturing apparatus according to the fourth embodiment of the present invention.

As shown in FIG. 13, the top cover 240 has a circular plate structure having cut-out portions at opposite sides thereof. The top cover 240 has a plurality of openings 244, and reinforcing rims 242 upwardly protruded from the top cover 240 around the openings 244. A seal member O, which may be an O-ring, is arranged on the top cover 240 inside each opening 244.

Preferably, the top cover 240 has two or three openings 244, and each opening 244 has a rectangular shape. Of course, other numbers and shapes of the openings 244 may be used. A seat 246 is provided on the top cover 240 around each opening 244 inside the associated reinforcing rim 242, with a flange 243 extending outward from a lower end of each reinforcing him 242. An auxiliary cover 248 is seated on each seat 246 under the condition in which one O-ring, that is, seal member O, is interposed between the seat 246 and the auxiliary cover 248, in order to generate a sealing effect between the seat 246 and the auxiliary cover 248. Wire connecting rings 250 are fixed to the top cover 240 and auxiliary covers 248, in order to connect the top cover 240 and auxiliary covers 248, using wires, to a crane mounted to the ceiling of a clean room, in which the FPD manufacturing apparatus installed, and thus, to enable the top cover 240 and auxiliary covers 248 to be moved by the crane. Preferably, the wire connecting rings 250 are fixed to respective corners of the top cover 240, to respective opposite sides of each reinforcing rim 242, and to respective opposite sides of each auxiliary cover 248. Transverse reinforcing members (not shown), each of which has a length identical to the width of each opening 244, may be arranged at the top cover 240 along desired sides of the associated opening 244, in order to prevent the top cover 240 from being twisted due to heat applied thereto.

The top cover 240 may be made of stainless steel in order to obtain a desired rigidity and a desired durability, and thus, to prevent the top cover 240 from generating an excessive strain.

Each auxiliary cover 248 may have a rectangular parallelepiped box structure. In this case, the rectangular parallelepiped box structure of each auxiliary cover 240 may be upwardly opened, in order to reduce the weight of the auxiliary cover 240. As described above, a pair of wire connecting rings 250 are fixed to the upper end of each auxiliary cover 248 at opposite sides of the auxiliary cover 248, respectively, to enable the auxiliary cover 248 to be moved by the crane. Each auxiliary cover 248 is made of aluminum so that the auxiliary cover 248 has a reduced weight.

As shown in FIG. 12, the feeding robot 220 includes a feeding arm 224. The feeding robot 220 also includes a driver 222 to supply a drive force to the feeding arm 224. Although not shown, the feeding robot 220 further includes a robot housing, and an end effecter, on which a substrate to be fed is seated. When it is desired to remove the feeding robot 220 from the feeding chamber 200, for maintenance and repair of the feeding robot 220, the removal of the feeding robot 220 is carried out under the condition in which the feeding arm 224 and driver 222 of the feeding robot 220 are separated from each other, because the feeding chamber 200 has a limited height.

The top cover 240 has a large size, and thus, a large weight, because the feeding chamber 200 has a large size so as to feed a large-size substrate. Accordingly, the top cover 240 must be divided into several sections to distribute the weight of the top cover 240 to those sections, and thus, to enable the top cover 240 to be moved by a crane adapted to move a limited weight. To this end, the top cover 240 according to this embodiment has the above-described divided structure, which includes a plurality of auxiliary covers 248.

Although the divided structure of the top cover 240 according to this embodiment has been described as being applied to the feeding chamber 200, this structure may also be applicable to the processing chamber, which may be a plasma processing device, for example, a chemical vapor deposition (CVD) device, an etcher, or an asher.

When it is desired to move the top cover 240 installed on the top of the feeding chamber 200 in the FPD manufacturing apparatus according to this embodiment, the auxiliary covers 248, which constitute the divided structure of the top cover 240, are sequentially moved by the crane mounted to the clean room under the condition in which the wire connecting rings 250 of each auxiliary cover 248 are connected to a hook included in the crane.

Thereafter, the top cover 240, which has a reduced weight in accordance with separation of the auxiliary covers 248 from the top cover 240, is moved to a desired place by the crane under the condition in which the wire connecting rings 250 of each auxiliary cover 248 are connected to the hook of the crane. The feeding robot 220 is then outwardly moved from the feeding chamber 200, for maintenance and repair. After completion of the maintenance and repair, the feeding robot 220 is again positioned in the feeding chamber 200 in accordance with a procedure carried out in the order reverse to the above-described procedure.

The top cover 240 may be separated when it is necessary to perform maintenance and repair for the feeding robot 220 or other large-size inner structures arranged in the feeding chamber 200. On the other hand, the auxiliary covers 248 may be separated when it is necessary to perform simple maintenance and repair for the feeding chamber 200.

Thus, in accordance with this embodiment, the top cover 240 has the divided structure including a plurality of detachable auxiliary covers 248 to distribute the weight of the top cover 240 to the auxiliary covers 248, and thus, to enable the top cover 240 to be easily separated from the large-size feeding chamber 200, using a crane having a limited capacity. After separation of the auxiliary covers 248, the weight of the top cover 240 is correspondingly reduced, so that it is possible to move the top cover 240 by the crane without any overload applied to the crane.

Fifth Embodiment

This embodiment provides a load lock chamber having a simple structure, and thus, exhibiting a reduction in manufacturing costs and a reduction in the time taken to load/unload a substrate.

Figure 14:
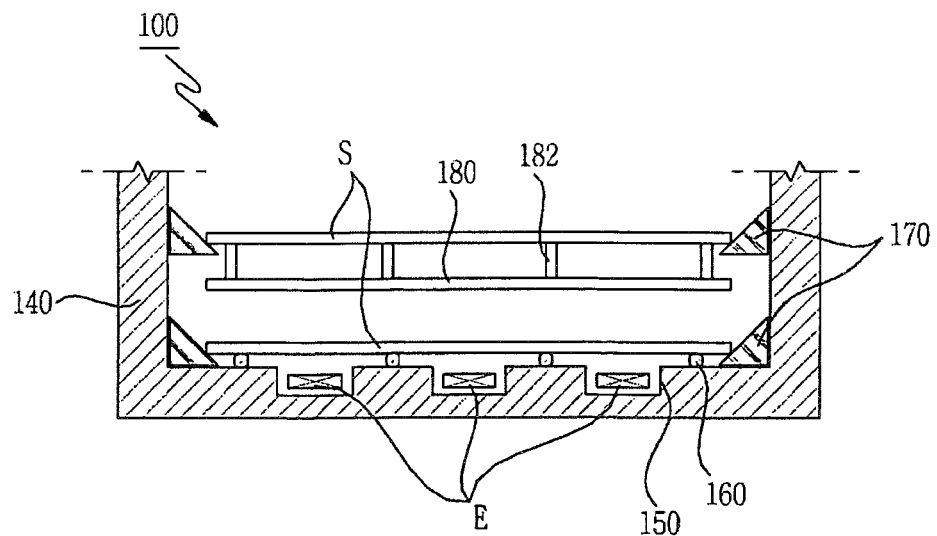
FIG. 14 is a transversal sectional view illustrating a structure of a load lock chamber according to a fifth embodiment of the present invention.

As shown in FIG. 14, the load lock chamber 100 according to this embodiment includes a chamber housing 140, openings (not shown), gate valves (not shown), and end effecter receiving grooves 150.

The chamber housing 140 defines, therein, a chamber in which vacuum can be established. Since the load lock chamber repeatedly and alternately establishes an atmospheric state and a vacuum state, the load lock chamber 100 includes a pumping device to establish the vacuum state in the load lock chamber, and a venting device to establish the atmospheric state in the load lock chamber.

Two openings are formed at opposite side walls of the chamber housing 140 such that the openings face each other. One opening, which is formed at the side wall of the chamber housing 140 arranged adjacent to the feeding chamber 200, is used as a gateway to load a substrate into the feeding chamber 200 and to unload the substrate from the feeding chamber 200. On the other hand, the other opening, which is formed at the opposite side wall, is used as a gateway to load a substrate from the outside of the load lock chamber 100 into the load lock chamber 100 and to unload the substrate from the load lock chamber 100 to the outside of the load lock chamber 100. Each opening is opened and closed by a gate valve. The gate valve has a structure capable of preventing a gap from being formed between the gate valve and the opening in a closed state of the opening, thereby maintaining the chamber to be in a sealed state.

Each end effect receiving groove 150 defines a path, along which an associated end effecter E of the feeding robot moves to enter the load lock chamber 100. The end effecters E of the feeding robot, on which a substrate is laid, enter the load lock chamber 100 under the condition in which the end effectors E are received in respective end effecter receiving grooves 150 while being lifted to a level, at which the substrate does not come into contact with a bottom wall of the chamber housing 140. To this end, each end effecter receiving groove 150 is formed at the bottom wall of the chamber housing 140 in the form of a groove having a predetermined depth capable of allowing the end effecter E to move vertically in the end effecter receiving groove 150. Accordingly, each end effecter E can move vertically in a state of being received in the associated end effecter receiving groove 150. When the end effecters E move downwardly in a state of carrying a substrate, the substrate is laid on the bottom wall of the chamber housing 140, so that the substrate is separated from the end effecters E. Under this condition, the end effecters E are outwardly retracted.

Preferably, substrate protection members 160 are arranged on the bottom wall of the chamber housing 140 at regions where the substrate laid on the bottom wall come into contact with the bottom wall, as shown in FIG. 14. Where the substrate comes into direct contact with the bottom wall of the chamber housing 140, the substrate may be damaged because the bottom wall of the chamber housing 140 has a hardness higher than that of the substrate. Accordingly, the substrate protection members, which are made of a material causing no damage to the substrate, are arranged on the bottom wall of the chamber housing 140.

Figure 15:
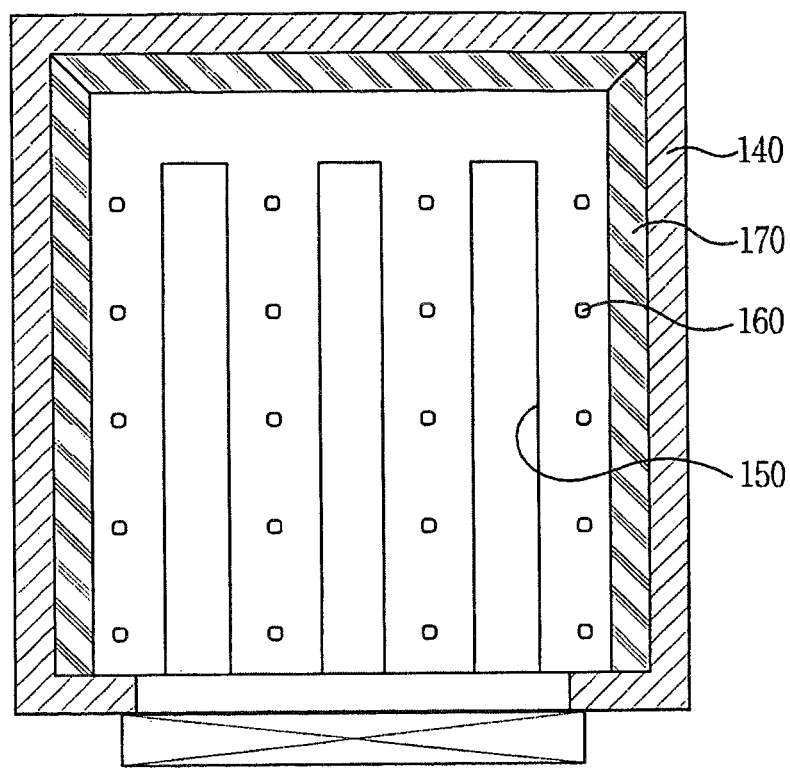
FIG. 15 is a longitudinal sectional view illustrating the structure of the load lock chamber according to the fifth embodiment of the present invention.

Preferably, a substrate guide 170 is also provided in the load lock chamber 100 according to this embodiment. The substrate guide 170 functions to guide a substrate to be loaded at an accurate position in the load lock chamber 100. In accordance with this embodiment, the substrate guide 170 is arranged along the edge of the bottom wall of the chamber housing 140. The substrate guide 170 has a structure inclined toward a central portion of the load lock chamber 100. Accordingly, when a substrate is loaded in the load lock chamber 100, the substrate is moved to an accurate position in the load lock chamber 100 as the edges of the substrate slide along the substrate guide 170. As shown in FIG. 15, the substrate guide 170 has a rectangular shape opened at one side to allow the end effecters E to access the load lock chamber 100 through the opened side. That is, the substrate guide 170 has a U-shaped structure having, at one side thereof, an opening to allow the end effecters to pass through the substrate guide 170.

Preferably, at least one loading die 180 is also arranged in the load lock chamber 100 according to this embodiment, as shown in FIG. 14. The loading die 180 functions to load a substrate S thereon. At least two loading dies 180 may be arranged in the load lock chamber 100, in order to simultaneously load at least two substrates. A plurality of uniformly-spaced substrate support members 182 are arranged on each loading die 180 such that the substrate support members 182 are upwardly protruded from the loading die 180. The substrate support members 182 are made of a material exhibiting a hardness lower than that of the substrate, in order to prevent the substrate support members 182 from damaging the substrate. The substrate support members 182 have a sufficient length to allow the end effecters E to move vertically in a state of being inserted into a gap defined between the associated loading die 180 and a substrate supported by the substrate support members 182.

Another substrate guide 170 is provided to perform a position correction for a substrate loaded on each loading die 180. As shown in FIG. 14, this substrate guide 170 is arranged around the associated loading die 180, and has an inclined structure having a lower end extending to a level lower than the upper end of each support member 182. Of course, a separate aligner may be arranged in the load lock chamber 100 to simultaneously align a plurality of substrates loaded on respective loading dies 180.

Figure 16:
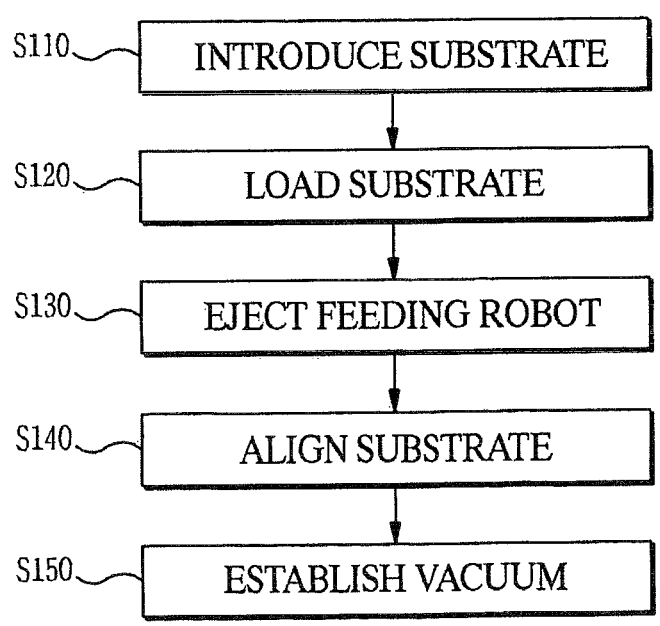
FIG. 16 is a flow chart illustrating a method for loading a substrate in the load lock chamber according to the fifth embodiment of the present invention.

Hereinafter, a method for loading substrates in the load lock chamber according to this embodiment will be described with reference to FIG. 16.

First, step S110 of introducing a substrate S into the load lock chamber 100 is executed. At step S110, one gate valve is driven to open one opening of the load lock chamber 100. Thereafter, a substrate is introduced into the load lock chamber 100 through the opened opening, using the substrate feeding robot arranged outside the load lock chamber 100. At this time, the end effecters E of the substrate feeding robot are inserted into the end effecter receiving grooves formed at the bottom wall of the load lock chamber 100.

Subsequently, step S120 of loading the substrate S in the load lock chamber 100 is executed. At step S120, the substrate feeding robot is driven to downwardly move the end effecters E in respective end effecter receiving grooves 212 until the substrate S on the end effecters E is laid on the bottom wall of the load lock chamber 100. Thus, the substrate S is completely loaded in the load lock chamber 100.

Thereafter, step S130 of ejecting the substrate feeding robot from the load lock chamber 100 is executed. At step S130, the substrate feeding robot is horizontally moved until the end effecters E are completely removed from the load lock chamber 100.

Next, step S140 of aligning the substrate S loaded in the load lock chamber 100 to accurately position the substrate S is executed. Where the substrate guide 170 is used, step S140 is executed simultaneously with step S120 because, when the substrate S is loaded on the bottom wall of the load lock chamber 100 at the substrate loading step S120, the substrate S slides along the substrate guide 170 arranged along the edge of the bottom wall of the load lock chamber 100, and thus, moves to an accurate position. Of course, where a separate aligner is used, the substrate aligning step S140 is executed independently of the substrate loading step S120.

Finally, step S150 of establishing a vacuum atmosphere in the load lock chamber 100 is executed. At step S150, the gate valve is driven to close the opened opening. The vacuum pump is then driven to vent gas present in the load lock chamber 100.

Meanwhile, when it is desired to load a plurality of substrates in the load lock chamber 100, steps S110, S120, and S130 are repeatedly executed until all substrates are loaded in the load lock chamber 100. Thereafter, steps S140 and S150 are executed.

Sixth Embodiment

This embodiment provides a feeding chamber having a structure capable of allowing the feeding robot to pass through one side wall of the feeding chamber.

Figure 17A:
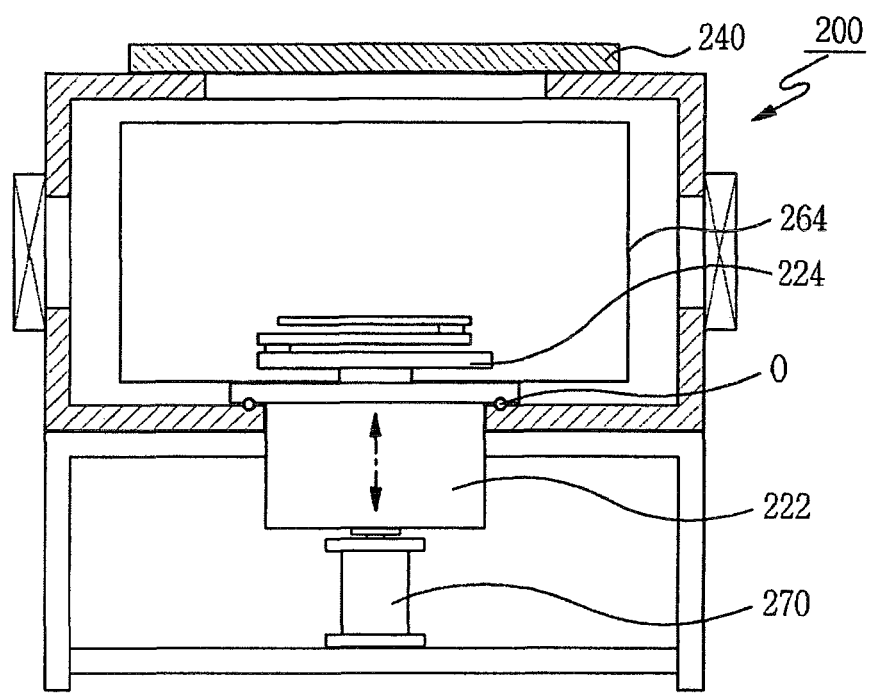
FIGS. 17a and 17b are sectional views illustrating a procedure for unloading a feeding robot from a feeding chamber included in an FPD manufacturing apparatus according to a sixth embodiment of the present invention, respectively.
Figure 17B:
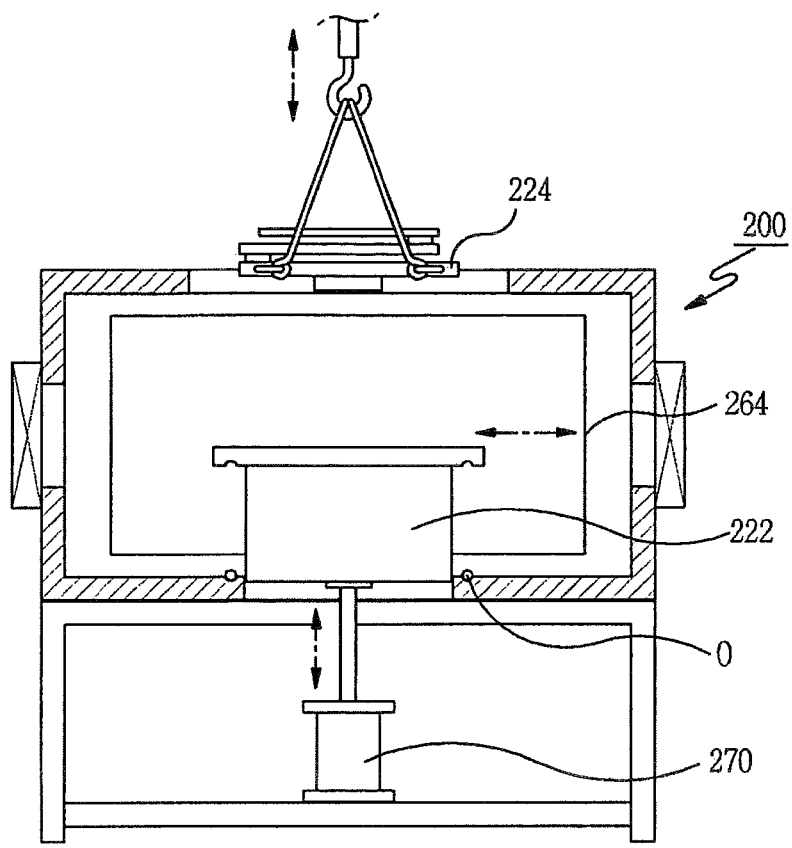

In an FPD manufacturing apparatus including a plurality of chambers, the feeding chamber according to this embodiment functions to load a substrate into a selected one of the chambers, for example, a load lock chamber or a processing chamber, and to unload the substrate from the selected chamber. As shown in FIGS. 17a and 17b, the feeding chamber 200, which is configured in accordance with this embodiment, is provided, at opposite side walls thereof, with gateways, and gate valves to open/close the gateways, respectively. Also, the top cover 240 is mounted on the feeding chamber 200. The driver 222 of the feeding robot 220 adapted to feed a substrate is seated, at an upper end thereof, on the bottom wall of the feeding chamber 200 while extending downwardly through an opening formed at the bottom wall of the feeding chamber 200. A seal member O such as an O-ring is interposed between contact surfaces of the bottom wall of the feeding chamber 200 and the upper end of the driver 222.

As described above, the feeding robot 220 mainly includes the robot housing, the feeding arm 224 mounted to an upper end of the robot housing and foldable within a predetermined length range, the driver 222, which is mounted to a lower end of the robot housing, and the end effecters E, on which a substrate will be seated. When it is desired to remove the feeding robot 220 from the feeding chamber 200, for maintenance and repair of the feeding robot 220, the removal of the feeding robot 220 is carried out under the condition in which the feeding arm 224 and driver 222 of the feeding robot 220 are separated from each other, because the feeding chamber 200 has a limited height.

A driver gateway 266 is provided at one side wall of the feeding chamber 200, in order to allow the driver 222 of the feeding robot 220 to pass through the driver gateway 266 for installation of the driver 222 in the feeding chamber 200 and separation of the driver 222 from the feeding chamber 200. A door 264 is also provided at the side wall of the feeding chamber 200, in order to allow the feeding robot 220 to be removed from the feeding chamber 200 when it is desired to perform maintenance and repair for the feeding robot 220. The door 264 is hingably mounted to the side wall of the feeding chamber 200 where the driver gateway 266 is formed.

Extensions having a certain thickness extend inwardly from an inner surface of the driver gateway 266, in order to enable a seal member O to be installed between the driver gateway 266 and a rear surface edge of the door 264, and thus, to provide a sealing effect between the driver gateway 266 and the door 284.

Also, the seal member O, which is interposed between the contact surfaces of the bottom wall of the feeding chamber 200 and the upper end of the driver 222, provides a sealing effect between the feeding chamber 200 and the driver 222. A vertical driver 270 is also arranged beneath the driver 222 of the feeding robot 220. The vertical driver 270 functions to upwardly move the driver 222 to a desired level when the driver 222 is removed from the feeding chamber 200, and thus, to prevent the seal member O from being damaged during the removal of the driver 222. The vertical driver 270 also downwardly moves the driver 222 to an original position when the driver 222 is loaded into the feeding chamber 200.

Preferably, the vertical driver 270 comprises a cylinder.

Figure 18:
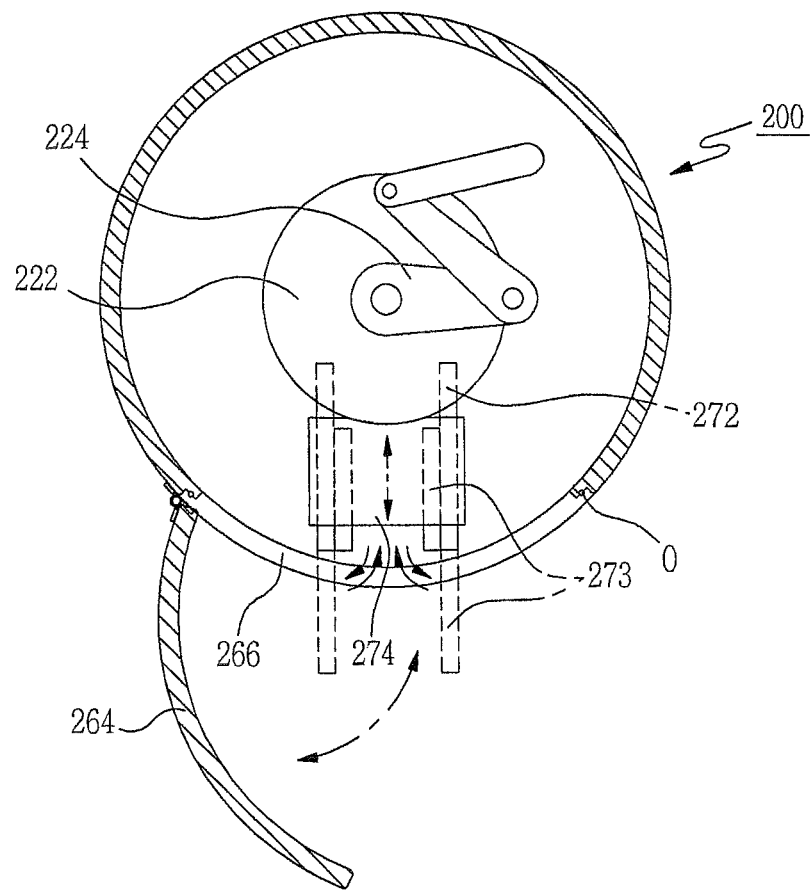
FIG. 18 is a plan view illustrating the feeding chamber of FIGS. 17a and 17b.

As shown in FIG. 18, the feeding chamber 200 also includes guide members 272 arranged between the driver gateway 266 and the driver 222 of the feeding robot 220. Each guide member 272 has the form of a rail. Auxiliary guide members 273 are hingably mounted to outer ends of the guide members 272, respectively, such that the auxiliary guide members 273 extend and retract through the driver gateway 266 in accordance with hinging operations thereof. A sliding plate 274 is slidably arranged on the guide members 272. The auxiliary guide members 273 may be slidably mounted to the guide members 272, respectively, such that the auxiliary guide members 273 extend and retract through the driver gateway 266.

Figure 19:
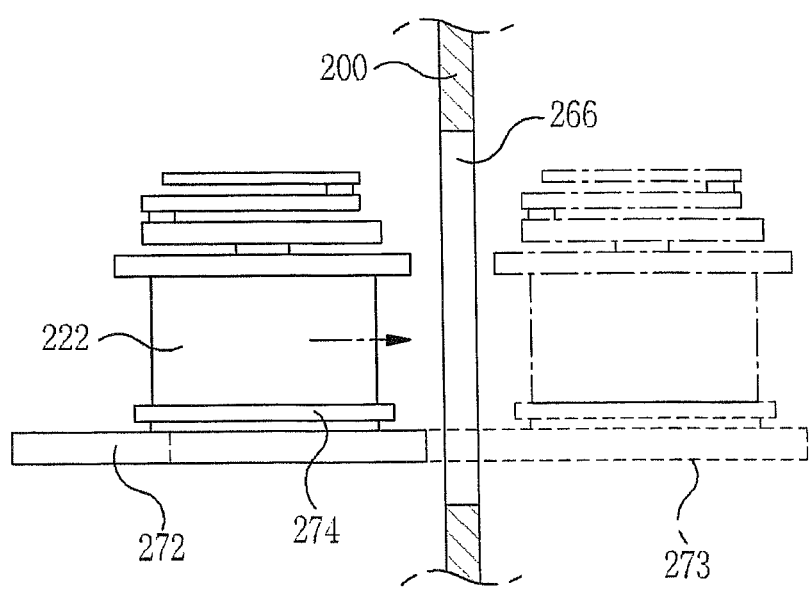
FIG. 19 is an elevation view illustrating a state in which the feeding robot is unloaded from the feeding chamber in the FPD manufacturing apparatus according to the sixth embodiment of the present invention.

When it is desired to remove the driver 222 of the feeding robot 220 from the feeding chamber 200, the driver 222 is first lifted and then laid on the sliding plate 274 slidably mounted on the guide members 272. The auxiliary guide members 273 are then hinged such that they extend outwardly from the feeding chamber 200. Under this condition, the sliding plate 274 is then moved along the guide members 272 and the auxiliary guide members 273, as shown in FIG. 19. Thus, the driver 222 can be easily removed from the feeding chamber 200. The loading of the driver 222 into the feeding chamber 200 can also be easily achieved in accordance with a procedure reverse to the above-described procedure. Normally, the auxiliary guide members 273 are maintained in a folded state. The auxiliary guide members 273 are unfolded in accordance with hinging operations thereof, only when the driver 222 of the feeding robot 220 is to be removed.

A transfer means (not shown) may be arranged in rear of the driver 222 of the feeding robot 220 in the feeding chamber 200, in order to transfer the driver 222 to the sliding plate 274.

Hereinafter, the procedure for loading the feeding robot 220 into the feeding chamber 200 and unloading the feeding robot 220 from the feeding chamber 200 in the FPD manufacturing apparatus according to this embodiment will be described with reference to FIGS. 17a, 17b, and 18. When it is desired to unload the feeding robot 220 from the feeding chamber 200, for maintenance and repair of the feeding robot 220, the vacuum state of the feeding chamber 200 is first released. Thereafter, the door 264 is hinged to open the driver gateway 266.

The top cover 240 is then removed from the feeding chamber 200, using the crane. Subsequently, the feeding arm 224 is manually separated from the driver 222, and then moved to the outside of the feeding chamber 100, using the crane.

Thereafter, the vertical driver 270, which is arranged beneath the driver 222 while being in contact with the driver 222, is driven to upwardly move the driver 222 to a level where the driver 222 can pass through the driver gateway 264 without any interference, while preventing the seal member O adapted to provide a sealing effect between the bottom wall of the feeding chamber 100 and the driver 222.

Next, the driver 222 is transferred to the sliding plate 274 by the transferring means. Where the auxiliary guide members 273 are slidably mounted to the guide members 272, respectively, such that the auxiliary guide members 273 extend and retract through the driver gateway 266, the transferring means also outwardly slides the auxiliary guide members 273 from the feeding chamber 200 along the guide members 272, as shown in FIG. 19. As a result, the driver 222 is removed from the feeding chamber 200.

Under this condition, maintenance and repair can be performed for the feeding arm 224 and driver 222 of the feeding robot 220. After the maintenance and repair, the driver 222 is again loaded into the feeding chamber 200 in accordance with a procedure reverse to the above-described procedure.

Thus, the feeding robot 220 can be loaded and unloaded through the driver gateway 264 formed at one side wall of the feeding chamber 200 under the condition in which the driver gateway 264 is opened by the door 266. Accordingly, it is possible to achieve the loading and unloading of the driver 222, even in the case in which the space defined between the feeding chamber 200 and the clean room is reduced due to the increased size of the feeding chamber 200.

Seventh Embodiment

This embodiment provides a vacuum chamber, which includes a separable bottom wall, in order to achieve an easy installation of structures to be arranged at a lower portion of the vacuum chamber, an easy function test for the structures, and easy maintenance and repair for the structures, and a repairing method for the structures.

Preferably, the vacuum chamber according to this embodiment is applied to the processing chamber 300 of the FPD manufacturing apparatus. In accordance with this embodiment, as shown in FIG. 20, the vacuum chamber 300 includes three sections, that is, a chamber body 330, a top cover 340, and a bottom cover 350, which are independently manufactured.

Figure 20:
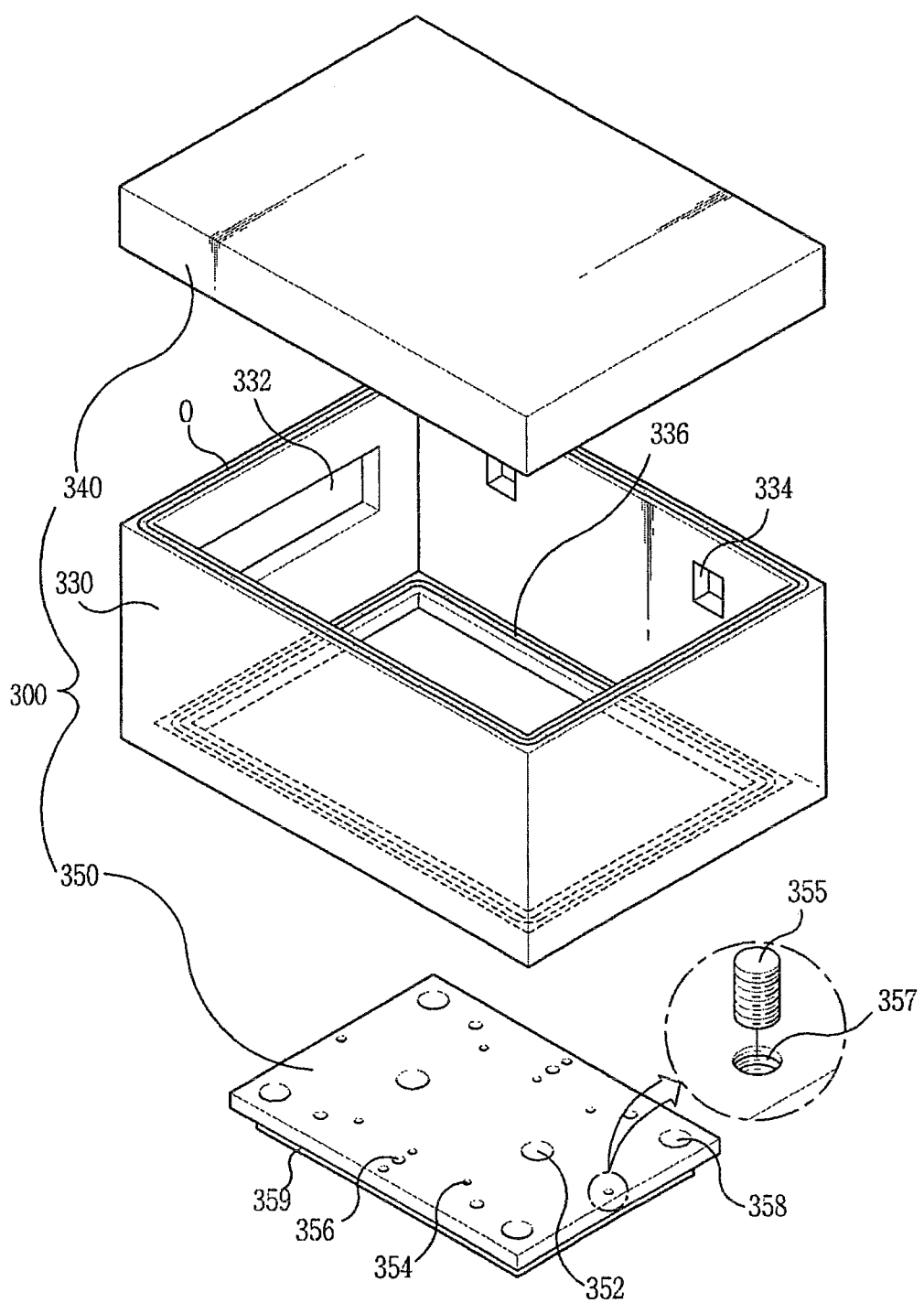
FIG. 20 is an exploded perspective view illustrating a structure of a vacuum chamber according to a seventh embodiment of the present invention.

As shown in FIG. 20, the chamber body 330 has a rectangular box structure including four side walls. The chamber body 330 forms a side wall section of the vacuum chamber 300, and defines the overall appearance of the vacuum chamber 300. The chamber body 330 is provided, at desired portions thereof, with an opening 332 to allow a substrate to pass through the opening 332 for loading of the substrate into the vacuum chamber 300 and unloading of the substrate from the vacuum chamber 300, and view ports 334 to allow the operator to observe a substrate processing procedure carried out in the vacuum chamber, using plasma, and the results exhibited in the substrate processing procedure.

The top cover 340 is coupled to an upper end of the chamber body 330 while being in contact with the upper end of the chamber body 330, thereby forming a top wall section of the vacuum chamber 300, as shown in FIG. 20. An upper electrode and a process gas supplying system are arranged at the top cover 340. Seal member receiving grooves are formed at respective coupling surfaces of the top cover 340 and chamber body 330. A seal member O is interposed between the seal member receiving grooves. The seal member O provides a sealing effect between the coupling surfaces of the top cover 340 and chamber body 330 so that vacuum can be established in the vacuum chamber 300. At least two seal members may be arranged to obtain an enhanced sealing effect.

As shown in FIG. 20, the bottom cover 350 is coupled to a lower end of the chamber body 330 while being in contact with the lower end of the chamber body 330, thereby forming a bottom wall section of the vacuum chamber 300. The bottom cover 350 is formed with various holes, for example, a driving hole 352 for a lower electrode, a driving hole 354 for an inner vertical reciprocation pin, a driving hole 356 for an outer vertical reciprocation bar, and a vacuum pump connecting hole 358. These holes correspond to positions where various elements to extend through the bottom cover 350 are arranged, respectively. That is, a drive shaft of a lower electrode driving module extends through the lower electrode driving hole 352. An inner vertical reciprocation pin driving module, which is adapted to vertically reciprocate the inner vertical reciprocation pin near the lower electrode, passes through the inner vertical reciprocation pin driving hole 354. An outer reciprocation bar driving module passes through the outer vertical reciprocation pin driving hole 356.

As shown in FIG. 20, an engagement rim 336 is horizontally protruded to a desired length from the inner side wall surface of the chamber body 330 along a region where the lower end of the chamber body 330 is coupled with the bottom cover 350. The bottom cover 350 is engaged, at a peripheral edge thereof, with the engagement rim 336 in the chamber body 330, so that the bottom cover 350 is coupled to the chamber body 330.

Preferably, the bottom cover 350 is provided, at the peripheral edge thereof, with an engagement groove 359 having a stepped shape conforming to the engagement rim 336. Since the engagement groove 359 has a shape conforming to the engagement rim 336, no gap is formed between the engagement surfaces of the engagement rim 336 and engagement groove 359 when the bottom cover 250 is coupled to the chamber body 330. In particular, the engagement surfaces of the engagement rim 336 and engagement groove 359 have a stepped shape, so that plasma generated in the vacuum chamber 300 cannot easily leak from the vacuum chamber 300 between the engagement surfaces because the plasma exhibits straightness. It is more preferable that the horizontal surface portion of each engagement surface be inclinedly formed. In this case, when the bottom cover 350 is coupled to the chamber body 330, the bottom cover 350 can be positioned at an accurate position without any position correction.

Preferably, seal member receiving grooves are formed at the engagement surfaces of the engagement rim 336 and engagement groove 359, respectively, as shown in FIG. 20. A seal member O is fitted between the seal member receiving grooves. The seal member O provides a sealing effect between the coupling surfaces of the lower cover 350 and chamber body 330 so that vacuum can be established in the vacuum chamber 300. At least two seal members may be arranged to obtain an enhanced sealing effect.

Preferably, a plurality of feeding device coupling holes 357 are formed at an upper surface of the bottom cover 50 along the peripheral edge of the bottom cover 50, as shown in FIG. 20. The feeding device coupling holes 357 function to enable a feeding device, for example, the crane, to easily carry out an operation for lifting the bottom cover 350 when the bottom cover 350 is to be coupled to the chamber body 330 or to be separated from the chamber body 330. Each feeding device coupling hole 357 has female threads to be threadedly coupled with male threads formed on an end of a feeding wire connected to the crane. Accordingly, the bottom cover 350 can be firmly connected to the crane, so that it is possible to easily raise the bottom cover 350, using the crane.

In accordance with this embodiment, coupling blocks 355 are preferably provided at the bottom cover 350. The coupling blocks 355 are fitted in respective feeding device coupling holes 357 to block the feeding device coupling holes 357 after completion of a bottom cover assembling or repair process. Where the feeding device coupling holes 357 are maintained in an opened state in the substrate treating process using plasma, diverse particles may be deposited in the feeding device coupling holes 357, or arc may be generated at the feeding device coupling holes 357 due to plasma. It is preferred that the coupling blocks 355 be fitted in respective feeding device coupling holes 357 such that the upper end of each coupling block 355 is flush with the upper surface of the bottom cover 350.

Figure 22:
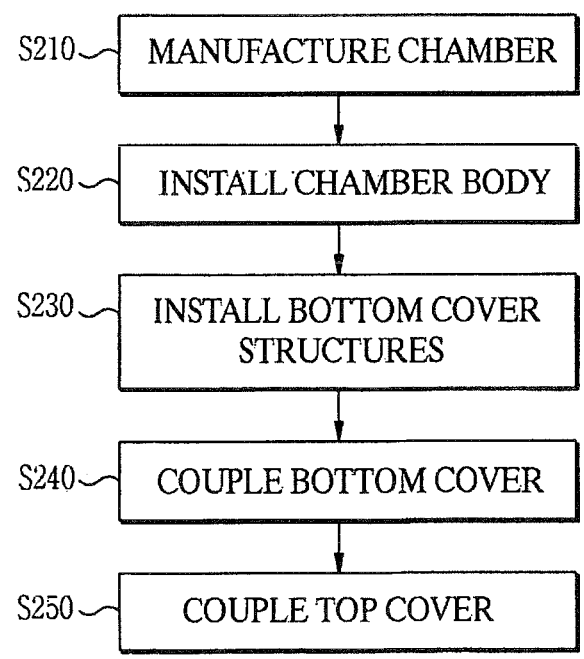
FIG. 22 is a flow chart illustrating a method for manufacturing and assembling a vacuum chamber according to the seventh embodiment of the present invention.

Now, the method for manufacturing and assembling the vacuum chamber in accordance with this embodiment will be described with reference to FIG. 22.

First, step S210 is executed to manufacture the vacuum chamber 300, which includes the chamber body 330, top cover 340, and bottom cover 350. At step S210, the manufacture of the vacuum chamber 300 is achieved by independently manufacturing the chamber body 330 forming the side wall portion of the vacuum chamber 300, the top cover 340 forming the top wall portion of the vacuum chamber 300, and the bottom cover 350 forming the bottom wall portion of the vacuum chamber 300.

Next, step S220 of installing the chamber body 330 on a main frame (not shown) is executed. At step S220, the chamber body 330 is first laid on the main frame, and is then fixed to the main frame. In detail, the chamber body 330 is lifted, using the feeding device, and is then laid on a portion of the main frame corresponding to a position where the chamber body 330 is coupled with the main frame. Thereafter, the position of the chamber body 330 on the main frame is adjusted so that the chamber body 330 is accurately positioned. After the chamber body 330 is positioned at an accurate position on the main frame, the chamber body 330 is firmly fixed to the main frame so that the chamber body 330 cannot move.

Thereafter, step S230 of installing structures on the top and bottom covers 340 and 350 is executed. At step S230, the bottom cover 350 is first positioned on a working die spaced apart from the bottom of the chamber body 330 by a long distance to allow the structure installing process to be easily carried out. Under this condition, accordingly, it is possible to easily perform processes for installing structures such as the lower electrode driving module, inner vertical reciprocation pin driving module, outer vertical reciprocation bar driving module, and vacuum chamber. Also, it is possible to easily perform a functional test for each structure because a wide space, in which the functional test is carried out, can be provided.

Subsequently, step S240 of coupling the bottom cover 350 to the chamber body 330, using the feeding device, is executed. At step S240, the bottom cover 350, for which the installation of the structures and the functional test for the structures have been completed, is coupled to the chamber body 330. In accordance with this embodiment, step S240 is executed, using a method of lifting the bottom cover 350 above the chamber body 330, lowering the bottom cover 350 into the chamber body 330, and coupling the bottom cover 350 to the chamber body 330. It is preferred that step S240 comprise steps of: a) lifting the bottom cover 350 to a level higher than the chamber body 330; b) moving the bottom cover 350 to a position where the bottom cover 350 is positioned just over the chamber body 330, and lowering the bottom cover 350 into the chamber body 330 such that the bottom cover 350 is mounted to the chamber body 330. Also, it is preferred that step S240 further comprise the step of c) firmly fixing the bottom cover 350 to the chamber body 330. When the bottom cover 350 is coupled to the chamber body 330 in accordance with the above-described method, the coupling of the bottom cover 350 becomes firm due to the weights of the bottom cover 350 and the structures installed on the bottom cover 350. However, it is more preferable that the fixing step be further executed, in order to more firmly couple the bottom cover 350 to the chamber body 330, taking into consideration the fact that large parts of the structures installed on the bottom cover 350 are driven.

Finally, step S250 of coupling the top cover 340 to the chamber body 330, using the feeding device, is executed. At step S250, the top cover 340, on which desired structures have been installed, is coupled to the upper end of the chamber body 330. Step S250 is executed by lifting the top cover 340 above the chamber body 330, lowering the top cover 340 such that the top cover 340 is positioned on the chamber body 330, and firmly coupling the top cover 340 to the chamber body 330.

Thus, the assembly of the vacuum chamber 300 according to this embodiment is completed.

Figure 23:
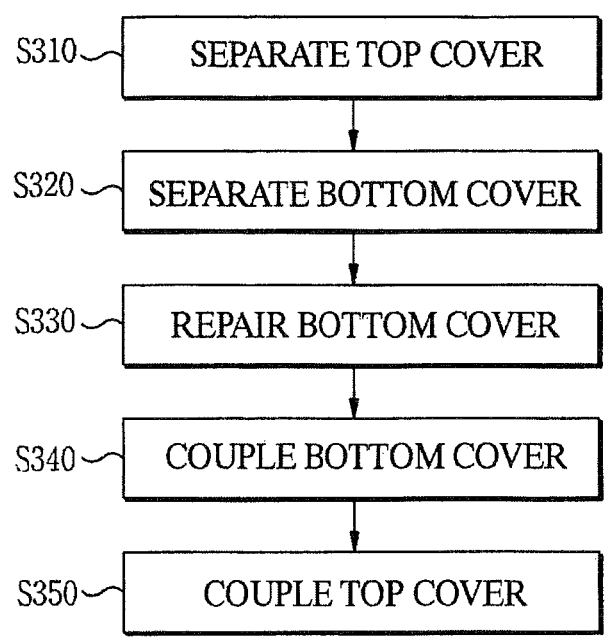
FIG. 23 is a flow chart illustrating a method for repairing the vacuum chamber according to the seventh embodiment of the present invention.

Hereinafter, the method for repairing the vacuum chamber according to this embodiment will be described with reference to FIG. 23.

First, step S310 of separating the top cover 340 is executed. At step S310, the top cover 340 is separated from the chamber body 330, using a top cover opening device included in the plasma-using substrate processing device or a separate feeding device, thereby opening the top wall section of the vacuum chamber 300.

Next, step S320 of separating the bottom cover 350, and laying the bottom cover 350 on the working die is executed. At step S320, the feeding device is first coupled with the feeding device coupling holes 357 of the bottom cover 350. Under this condition, the feeding device lifts the bottom cover 350, and feeds the bottom cover 350 to a place where the working die is located, and then lays the bottom cover 350 on the working die. Thus, the operator can perform a repair process for the bottom cover 350 on the working die. The working die is configured to maintain the bottom cover 350 at a level spaced apart from the ground by a considerable vertical distance so that the operator can easily perform the repair process in a state of entering a space beneath the working die.

Step S330 of repairing the bottom cover 350 and the structures installed on the bottom cover 350 is then executed. At step S330, a repair process is executed for parts of the structures to be repaired.

Thereafter, step S340 of coupling the bottom cover 350 to the chamber body 330 is executed. At step S340, the bottom cover 350, which has been completely repaired, is moved to an original position in the chamber body 330, using the feeding device. This step is executed in the order reverse to that of the bottom cover separating step S320.

Finally, step S350 of coupling the top cover 340 to the chamber body 330 is executed. Step S350 is executed in the order reverse to that of the top cover separating step S310.

Thus, the top and bottom covers 340 and 350 are positioned at respective original positions thereof, so that the repair process for the vacuum chamber 300 is completed.

In accordance with the above-described embodiments of the present invention, various advantages and effects are obtained.

That is, in accordance with the first embodiment, one seal member is arranged on the extension formed at each end of the peripheral wall plate of a chamber to maintain the chamber in a vacuum state, and one cover member is arranged on the seal member to cover the seal member. Accordingly, there is an advantage in that the life span of the seal member increases.

When it is desired to replace the seal member with a new one, this replacement can be achieved by separating only the cover member without separation of the peripheral wall plate, top plate and bottom plate, which constitute the chamber. Accordingly, it is possible to easily achieve maintenance and repair for the chamber.

In accordance with the second embodiment, at least one of the load lock chamber, feeding chamber, and processing chamber, which constitute an FPD manufacturing apparatus, has a vertically-stacked chamber structure including at least two sub chambers. Accordingly, there is an advantage of an enhancement in process efficiency, and thus, an increase in productivity. That is, where the processing chamber includes two sub chambers, there is an effect capable of simultaneously performing two identical processes or two different processes.

Also, the coupling between the sub chambers is achieved, using the protrusion/groove type structures. Accordingly, it is possible to minimize the overall height of the chamber, and to obtain an increased coupling force of the sub chambers, and thus, to obtain an optimal space efficiency.

Since the sub chambers are coupled to each other, using the protrusion/groove type structures, there are advantages in that it is possible to firmly couple the sub chambers, and to easily separate the sub chambers from each other.

In accordance with the third embodiment, the vacuum chamber is not manufactured in the form of a singe body, but manufactured in the form of a plurality of chamber sections, which will be assembled to form the vacuum chamber. Accordingly, there is an advantage in that it is possible to easily transport the vacuum chamber, manufactured to have a large size, to an installation place. That is, where such a large-size vacuum chamber is manufactured in the form of a single body, it is impossible to transport the vacuum chamber, using a vehicle. However, where the vacuum chamber is manufactured in the form of a plurality of chamber sections, it is possible to easily achieve transportation of the vacuum chamber by transporting the chamber sections, each of which has a reduced width, as compared to the vacuum chamber. Of course, the vacuum chamber is completely formed by assembling the chamber sections after the transportation thereof to an installation plate. Also, there is no problem in establishing a vacuum atmosphere in the assembled vacuum chamber.

Furthermore, where a vacuum chamber having a width of 3 m or more is manufactured in the form of a single body, it is necessary to machine a large-size metal body to form the vacuum chamber. For this reason, the machining means adapted to machine the metal body must also have a large size. The machining process is also difficult. However, such problems are eliminated in accordance with the present invention.

In addition, there is an advantage of easy maintenance and repair in that the maintenance and repair process for damaged inner structures of the vacuum chamber can be carried out under the condition in which only a part of the chamber sections is separated from the vacuum chamber.

In accordance with the fourth embodiment, the top cover arranged on the vacuum chamber has a divided structure including one or more detachable auxiliary covers, in order to distribute the weight of the top cover to the auxiliary covers in the procedure of separating the top cover from the vacuum chamber to allow the feeding robot to pass through the vacuum chamber upon loading or unloading the feeding robot, for maintenance and repair of the feeding robot. In the procedure of separating the top cover from the vacuum chamber, the auxiliary covers are individually separated from the top cover by the crane. Accordingly, the separation and assembly of the top cover can be achieved within a weight range allowable by the crane. Thus, the separation and assembly of the top cover can be easily achieved.

In accordance with the fifth embodiment, it is unnecessary to arrange lift pins and aligners in the load lock chamber. Accordingly, there are advantages of a simple structure and a reduction in manufacturing costs. Also, the process for loading a substrate into the load lock chamber is simple. Accordingly, the time taken to load a substrate is reduced, so that the overall substrate processing time is reduced.

In accordance with the sixth embodiment, the driver of the feeding robot can be loaded or unloaded through the driver gateway provided at one side of the feeding chamber, in the procedure of loading or unloading the feeding robot, for assembly, maintenance or repair of the feeding robot. Accordingly, it is possible to achieve the loading and unloading of the driver without using the crane. As a result, the time taken to load or unload the driver is reduced.

Also, the unloading of the driver is carried out in a state of being lifted to a desired level by the vertical driver, which is arranged beneath the feeding robot in order to move the driver of the feeding robot to the level of the driver gateway while preventing damage of the seal member adapted to provide a seal effect between the feeding chamber and the feeding robot. The unloading and loading of the feeding robot driver can also be easily achieved by the guide members and the auxiliary guide members hingably or slidably mounted to the guide members such that the auxiliary guide members extend and retract through the driver gateway.

Figure 21:
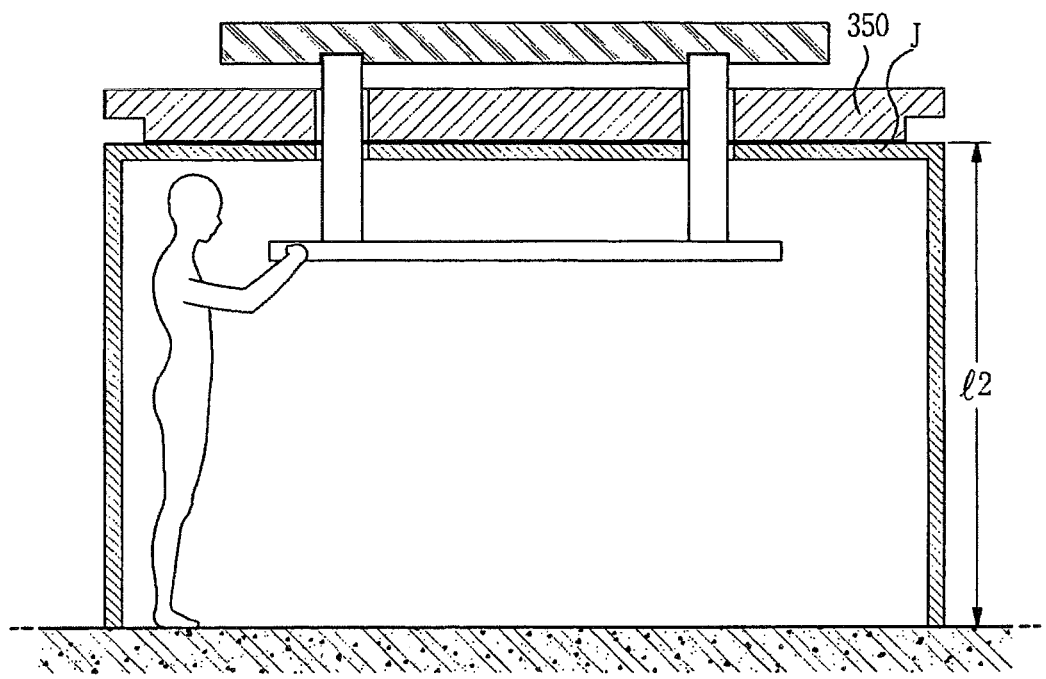
FIG. 21 is a schematic view illustrating a process for assembling and repairing a bottom cover in accordance with the seventh embodiment of the present invention.

In accordance with the seventh embodiment, as shown in FIG. 21, the working die J having a sufficient height l to enable the operator to perform a repair process in a state of entering a space beneath the working die J. Accordingly, the operator can easily perform an assembling process for structures to be installed on the bottom cover, and a repair process for the installed structures under the condition in which the bottom cover is laid on the working die J. Thus, it is possible to completely eliminate the difficulty encountered in executing the structure assembling process and the bottom cover repair process in conventional cases in which the height of the main frame from the ground is short. Since the operator can perform the structure assembling process and the bottom cover repair process in an upright state, the time taken to perform the structure assembling process and the bottom cover repair process is greatly reduced. In addition, there is an advantage in that it is possible to prevent accidents from occurring during the execution of the processes.

What is claimed is:

1. A flat-panel display manufacturing apparatus having a feeding chamber configured to feed substrates to one or more processing chambers, the feeding chamber comprising:
   a chamber housing having a top wall, a bottom wall, and an outer wall extending therebetween to define a receiving space in which a feeding robot is received, and a gateway formed in the top wall so as to allow the feeding robot arranged in the chamber housing to move outward from of the receiving space formed in the chamber housing;
   a top cover coupled to the top wall of the chamber housing so as to selectively open and close the gateway, wherein the top cover includes one or more openings formed therein;
   one or more auxiliary covers respectively coupled to the one or more openings in the top cover so as to selectively open and close the one or more openings; and
   one or more first seal members corresponding to the one or more openings and the one or more auxiliary covers, wherein each of the one or more first seal members is interposed between the top cover and a respective auxiliary cover so as to provide a seal between the top cover and the one or more auxiliary covers.

2. The flat-panel display manufacturing apparatus according to claim 1, wherein the top cover is made of stainless steel and the one or more auxiliary covers are made of aluminum.

3. The flat-panel display manufacturing apparatus according to claim 2, wherein the one or more auxiliary covers comprises two or three auxiliary covers.

4. The flat-panel display manufacturing apparatus according to claim 3, further comprising:
   main connecting rings provided at an upper portion of the top cover so as to connect the top cover to an overhead movement device; and
   auxiliary connecting rings provided at an upper portion of each of the one or more auxiliary covers so as to connect the auxiliary cover to the overhead movement device.

5. The flat-panel display manufacturing apparatus according to claim 1, wherein the one or more openings formed in the top cover comprises a plurality of openings, and the one or more auxiliary covers comprises a corresponding plurality of auxiliary covers, and wherein each auxiliary cover selectively opens and closes its respective opening in the top cover independently of the remaining auxiliary covers of the plurality of auxiliary covers.

6. The flat-panel display manufacturing apparatus according to claim 5, wherein each of the plurality of openings in the top cover is defined by a rim that extends upward along an outer periphery of its respective opening and a seat that extends inward from a lower end of the rim so as to form a surface on which its respective auxiliary cover is seated.

7. The flat-panel display manufacturing apparatus according to claim 6, wherein the seat of the top cover is positioned at the gateway formed in the top wall of the chamber housing such that an opening are a defined by the top cover is less than an opening area defined by the gateway.

8. The flat-panel display manufacturing apparatus according to claim 6, wherein the top cover further comprises a flange that extends outward from the lower end of the rim, wherein a bottom surface of the flange is seated on a top surface of the top wall of the chamber housing.

9. The flat-panel display manufacturing apparatus according to claim 8, further comprising one or more second seal members positioned between the bottom of the surface of the flange and the top surface of the top wall of the chamber housing, wherein the one or more first seal members are positioned between each auxiliary cover and its respective seat.

10. The flat-panel display manufacturing apparatus according to claim 1, wherein the top wall is oriented horizontally, and extends inward from a top edge of the outer wall toward a center of an opening formed in the top wall that defines the gateway.

11. The flat-panel display manufacturing apparatus according to claim 1, wherein the gateway formed in the top wall is larger than the one or more openings formed in the top cover.

* * * * *